United States Patent
Ripley et al.

(10) Patent No.: US 9,712,196 B2
(45) Date of Patent: Jul. 18, 2017

(54) TUNABLE NOTCH FILTER

(71) Applicant: Skyworks Solutions, Inc., Woburn, MA (US)

(72) Inventors: David Steven Ripley, Marion, IA (US); Edward F. Lawrence, Marion, IA (US); Joshua Kawika Ellis, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/247,616

(22) Filed: Aug. 25, 2016

(65) Prior Publication Data

US 2017/0063411 A1 Mar. 2, 2017

Related U.S. Application Data

(60) Provisional application No. 62/211,557, filed on Aug. 28, 2015.

(51) Int. Cl.
| | | |
|---|---|---|
| *H04B 1/04* | (2006.01) | |
| *H03H 7/01* | (2006.01) | |
| *H03H 7/46* | (2006.01) | |
| *H04B 1/10* | (2006.01) | |

(52) U.S. Cl.
CPC ......... *H04B 1/1036* (2013.01); *H03H 7/0115* (2013.01); *H04B 2001/1063* (2013.01)

(58) Field of Classification Search
CPC .... H01P 1/10; H01P 1/15; H04B 1/00; H04B 1/10; H04B 1/04; H04B 1/1036; H04B 1/0458; H04B 1/0475; H03H 7/01; H03H 7/0123; H03H 7/46; H03H 7/468
See application file for complete search history.

(56) References Cited

U.S. PATENT DOCUMENTS

| | | | |
|---|---|---|---|
| 8,982,007 B2 | 3/2015 | Davidson | |
| 9,002,309 B2* | 4/2015 | Sahota | H04B 1/006 455/266 |
| 9,118,376 B2 | 8/2015 | Khlat et al. | |
| 9,178,493 B1 | 11/2015 | Nobbe | |
| 9,190,699 B2* | 11/2015 | Granger-Jones | H01P 1/15 |
| 2009/0117871 A1 | 5/2009 | Burgener et al. | |
| 2009/0295501 A1* | 12/2009 | Hayashi | H03H 7/463 333/132 |
| 2011/0105055 A1 | 5/2011 | Ilkov | |
| 2011/0175687 A1 | 7/2011 | Morris, III | |

(Continued)

OTHER PUBLICATIONS

PCT International Search Report of Dec. 1, 2016 for International Patent Application No. PCT/US2016/048789, filed Aug. 25, 2016, 3 pages.

(Continued)

*Primary Examiner* — Blane Jackson
(74) *Attorney, Agent, or Firm* — Knobbe, Martens, Olson & Bear, LLP

(57) ABSTRACT

Aspects of this disclosure relate to a tunable notch filter. In an embodiment, a tunable notch filter includes a series LC circuit in parallel with a tunable impedance circuit, and the tunable notch filter is in a radio frequency signal path associated with a common port of a multi-throw radio frequency switch. According to certain embodiments, the tunable notch filter can be in a radio frequency signal path between an antenna switch and an antenna port.

20 Claims, 15 Drawing Sheets

(56) References Cited

U.S. PATENT DOCUMENTS

| | | |
|---|---|---|
| 2011/0241797 A1 | 10/2011 | Shana'a et al. |
| 2011/0294443 A1 | 12/2011 | Nohra et al. |
| 2012/0013398 A1 | 1/2012 | Dabiri et al. |
| 2012/0302188 A1 | 11/2012 | Sahota et al. |
| 2013/0109434 A1 | 5/2013 | Dupuy et al. |
| 2013/0154761 A1* | 6/2013 | Ilkov .................. H03H 7/465 333/101 |
| 2013/0207872 A1 | 8/2013 | Bakalski |
| 2013/0241666 A1 | 9/2013 | Granger-Jones et al. |
| 2013/0250819 A1 | 9/2013 | Khlat et al. |
| 2013/0322309 A1 | 12/2013 | Smith |
| 2014/0028368 A1 | 1/2014 | Khlat |
| 2014/0055210 A1* | 2/2014 | Black .................. H04B 1/525 333/132 |
| 2014/0104132 A1 | 4/2014 | Bakalski et al. |
| 2014/0112213 A1 | 4/2014 | Norholm et al. |
| 2014/0120968 A1 | 5/2014 | Mahmood |
| 2014/0167878 A1 | 6/2014 | Lee |
| 2014/0273887 A1 | 9/2014 | Black et al. |
| 2014/0285286 A1* | 9/2014 | Bojer .................. H03H 7/0153 333/174 |
| 2015/0091776 A1 | 4/2015 | Gaynor et al. |
| 2015/0214995 A1 | 7/2015 | Kanemaru |
| 2015/0236671 A1* | 8/2015 | Smith .................. H03H 7/01 327/553 |
| 2016/0126990 A1 | 5/2016 | Leipold et al. |

OTHER PUBLICATIONS

PCT Written Opinion of Dec. 1, 2016 for International Patent Application No. PCT/US2016/048789, filed Aug. 25, 2016, 6 pages.

* cited by examiner

TUNABLE NOTCH FILTER

CROSS REFERENCE TO PRIORITY APPLICATION

This application claims the benefit of priority of U.S. Provisional Patent Application No. 62/211,557, filed Aug. 28, 2015 and titled "TUNABLE NOTCH FILTER," the disclosure of which is hereby incorporated by reference in its entirety herein.

BACKGROUND

Technical Field

Embodiments of this disclosure relate to electronic systems and, in particular, to radio frequency systems with tunable filters.

Description of Related Technology

A radio frequency (RF) telecommunications system can transmit and/or receive RF signals that meet demands of high density, high speed operation. Wireless communication devices, such as mobile phones, can include RF systems and transmit and receive signals in a cellular network. RF systems can include RF circuitry such as filters, RF amplifiers, and RF switches arranged to process RF signals.

Carrier aggregation in the cellular networks has been a driver for significant improvement in transmit harmonic levels such that a transmitter of a mobile phone may not significantly regrade receiver signals. It can be desirable to implement filtering without significantly degrading insertion loss to prevent the transmitter from degrading receiver signals.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a radio frequency system that includes an antenna switch having multiple throws, a low pass filter in a signal path between the antenna switch and an antenna port, and a tunable notch filter in the signal path between the antenna switch and the antenna port. The tunable notch filter includes a series LC circuit in parallel with a tunable impedance circuit. The series LC circuit is coupled in series between the antenna switch and the antenna port.

The tunable notch filter can provide a notch at a second harmonic frequency of a radio frequency signal propagating between the antenna switch and the antenna port. A radio frequency signal propagating between the antenna switch and the antenna port can have a power of at least 15 decibel-milliwatts. The series LC circuit can be inductive at frequencies above a resonant frequency of the series LC circuit. The series LC circuit can create a parallel resonance with the tunable impedance circuit to provide a notch in a frequency response of the tunable notch filter. The series LC circuit can effectively short the tunable impedance element at a frequency of a radio frequency signal propagating between the antenna switch and the antenna port.

The radio frequency system can further include a control circuit configured to control the tunable impedance circuit such that the impedance in parallel with the series LC circuit corresponds to a frequency of a radio frequency signal propagating between the antenna switch and the antenna port. The radio frequency system can include a control circuit configured to control the tunable impedance circuit so as to provide an impedance in parallel with the series LC circuit corresponding to a throw of the antenna switch that is activated.

The tunable impedance circuit can include a tunable capacitance circuit. The tunable capacitance circuit can include switches implemented on a silicon-on-insulator die on which the antenna switch is implemented. The tunable capacitance circuit can include a plurality of capacitors each in series with a respective switch.

The low pass filter can be an elliptical filter. The low pass filter can provide a short at a frequency of about 5 GHz. The low pass filter can provide a frequency trap at a third harmonic of a radio frequency signal being provided from the antenna switch to the antenna port.

The antenna switch can have at least 8 throws, for example. The antenna switch can have at least two poles in certain implementations.

The radio frequency system can further include a trim and control circuit including non-volatile memory storing trim data. The trim and control circuit can set a state of the tunable impedance circuit based at least partly on the trim data. According to certain implementations, non-volatile memory of the trim and control circuit includes fuse elements.

Another aspect of this disclosure is a packaged module that includes a multi-throw switch and a tunable notch filter. The multi-throw switch includes input/output ports and a common port. The multi-throw switch is configured to electrically connect a selected one of the input/output ports to the common port. The tunable notch filter includes a series LC circuit in parallel with a tunable impedance circuit. The tunable notch filter is coupled in series in a radio frequency signal path associated with the common port. The multi-throw switch and the tunable notch filter are enclosed within a common package.

The packaged module can further include a low pass filter in series with the tunable notch filter between the multi-throw switch and an antenna port. The tunable notch filter can provide rejection at a second harmonic of a carrier. The packaged module can further include a power amplifier included within the common package in some implementations. The packaged module can be a component for a mobile device.

The packaged module can further include a trim and control circuit including memory arranged to store trim data. The trim and control circuit can set astute of the tunable filter based at least partly on the trim data. The trim and control circuit can set the state of the tunable capacitance circuit based at least partly on adding trim data associated with a process trim state and data associated with notch tuning states. The trim data can represent a process variation associated with a fixed portion of the tunable notch filter.

Another aspect of this disclosure is a wireless communication device that includes an antenna, an antenna switch, and a tunable notch filter. The antenna is configured to transmit a radio frequency signal. The antenna switch is configured to electrically couple a first radio frequency signal path to the antenna in a first state and to electrically couple a second radio frequency signal path to the antenna in a second state. The tunable notch filter is coupled in series between the antenna switch and the antenna. The tunable notch filter includes a series LC circuit in parallel with a tunable impedance circuit.

The radio frequency signal can be carrier aggregated signal. The wireless communication device can be a smart phone. The radio frequency signal transmitted by the antenna can be filtered by the tunable notch filter and a low pass filter in series with the tunable notch filter.

Another aspect of this disclosure is a method of tuning a tunable notch filter that includes a series LC circuit in parallel with a tunable capacitance circuit. The method includes providing tuning data to the tunable capacitance to set a notch in a frequency response of the tunable filter at a first frequency. The method further includes adjusting the tuning data provided to the tunable capacitance circuit to move the notch in the frequency response of the tunable filter to a second frequency.

The method can include providing a radio frequency signal to the tunable notch filter by way of a multi-throw switch. The tunable notch filter can be in a signal path between the multi-throw switch and an antenna. In some other implementations, the tunable notch filter can be coupled between an output of a power amplifier and a common port of a multi-throw switch.

The tunable notch filter can suppress a second harmonic of a radio frequency signal being filtered by the tunable notch filter A multi-throw switch can provide radio frequency signals in different frequency bands to the tunable notch filter. The first frequency can correspond to a second harmonic of a first radio frequency signal provided by the multi-throw switch and the second frequency can correspond to a second harmonic of a second radio frequency signal provided by the multi-throw switch.

The method can include adding trim data representative of a process variation of the series LC circuit with notch tuning data to generate the tuning data. The method can include accessing the trim data from non-volatile memory.

Another aspect of this disclosure is a packaged module that includes a trim circuit including memory to store trim data, a tunable filter in a radio frequency signal path, and a control circuit configured to set a state of the tunable filter based on the trim data and data indicative of a desired characteristic of the tunable filter. The trim circuit, the tunable filter, and the control circuit are included within a common package.

The radio frequency signal path can be between an antenna switch and an antenna port.

The tunable filter can include a series LC circuit in parallel with a tunable capacitance circuit. The trim data can represent a process variation associated with the series LC circuit. The tunable filter can be a tunable notch filter and the desired characteristic of the tunable filter is a notch. The tunable notch filter can provide second harmonic rejection of a carrier.

The trim data can represent a process variation associated with a fixed portion of the tunable filter. The memory of the trim circuit can include non-volatile memory. For instance, the memory of the trim circuit can includes fuse elements.

For purposes of summarizing the disclosure, certain aspects, advantages and novel features of the innovations have been described herein. It is to be understood that not necessarily all such advantages may be achieved in accordance with any particular embodiment Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 15/247,742, titled "CONTOUR TUNING CIRCUIT," filed on even date herewith, the entire disclosure of which is hereby incorporated by reference herein. The present disclosure relates to U.S. patent application Ser. No. 15/247,639, titled "TUNABLE NOTCH FILTER AND CONTOUR TUNING CIRCUIT," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
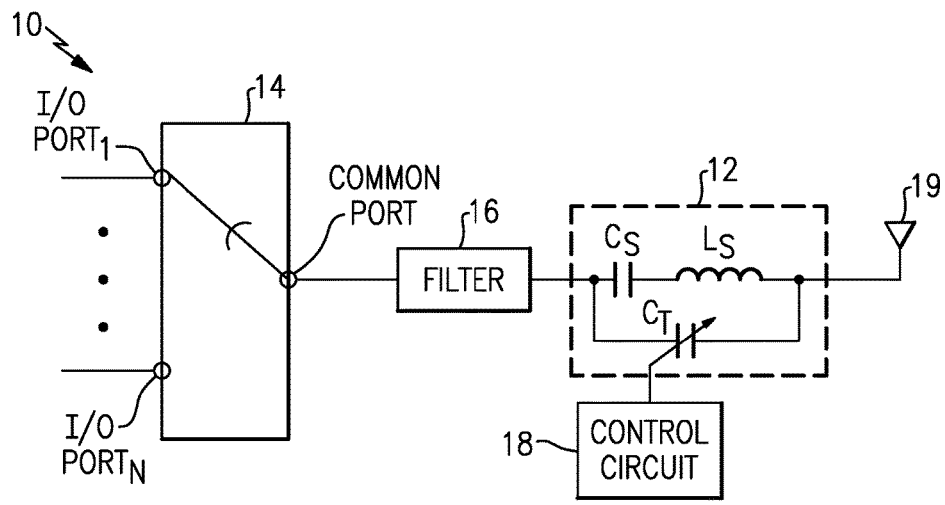
FIG. 1 is a schematic diagram of a radio frequency system that includes a tunable notch filter according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals and/or symbols can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As discussed above, carrier aggregation in cellular networks has been a driver for significant improvement in transmit harmonic levels such that a transmitter of a mobile device, such as a smart phone, may not significantly degrade the sensitivity of the receiver of the mobile device in certain applications. In an effort to avoid degrading insertion loss and implement additional filtering, it can be desirable to have a filter with tunable characteristics that can target higher rejection during specific operating modes. However, tuned elements of such a filter can regenerate harmonics in a large signal environment. This can limit the effective harmonic floor of the electronic system. This disclosure provides a tunable filter with a tuned network that can significantly reduce the large signal amplitude presented to the tuned element and cause the harmonic floor of the filter to be improved.

Some previous systems included fixed filter responses and would trade insertion loss for improved rejection. Other tunable filters having tuning elements with limited dynamic range can provide a small signal solution, but such tunable filters can have degraded performance for large signals, such as signals provided to an antenna for wireless transmission. A large signal can be a signal having a power of at least 15 decibel-milliwatts (dBm). In some instances, a large signal can have a power of at least 20 dBm.

Aspects of this disclosure relate to a tunable filter with a series/parallel resonant network that is tuned such that a series resonance circuit is arranged in parallel with a tuning element. The series resonance circuit can be a series LC circuit. The inductance and capacitance vales of the series resonant circuit can be selected to match a resonant frequency of a large signal carrier and provide an inductive effective impedance above the resonant frequency of the large signal carrier. The series resonance circuit can be arranged to present a low impedance at the frequency of a large signal carrier. This can effectively short the tuning element at the frequency of the large signal carrier. Accordingly, a relatively low voltage swing can be present across the tuning element. At frequencies above a resonant frequency of a series resonance circuit of the tunable filter, the effective impedance of the series resonance circuit can become inductive. This effective inductive impedance in parallel with the tuning element can create a parallel resonance that can be tuned to a desired frequency for rejection by tuning the tuning element. The tuning element can be, for example, a tunable capacitance circuit. The tunable filter can provide, for example, rejection at a second harmonic of a large signal carrier.

In certain embodiments, a tunable filter in accordance with the principles and advantages discussed herein can be coupled in series in a signal path between an antenna switch and an antenna port. The tunable filter can be in series with a low pass filter between the antenna switch and the antenna port. The tunable filter can be a tunable notch filter. The tunable filter can include a series LC circuit in parallel with a tunable impedance circuit, such as a tunable capacitance circuit. The impedance of the tunable impedance circuit can be adjusted such that the tunable filter provides a desired characteristic for a signal being provided from the antenna switch module to the antenna port. For instance, the antenna switch module can include a multi-throw switch and, depending on a frequency band associated with a throw of the multi-throw switch that is activated, the tunable impedance circuit can be set to a state that results in rejection of a second harmonic associated with the frequency band of the activated throw of the multi-throw switch.

According to some other embodiments, a tunable filter in accordance with the principles and advantages discussed herein can be implemented to filter an output of a power amplifier. In such embodiments, the tunable filter can reduce harmonics in signals amplified by the power amplifier.

Advantageously, the tunable filters discuss herein can provide tunability in a large signal environment. Insertion loss to a desired carrier can be relatively low due to relatively high quality factor (Q) series resonance (e.g., a Q of greater than 20), while 20 dB or more of rejection can be introduced at frequencies above the frequency of a large signal carrier in certain embodiments. The tunable filters discussed herein can address difficulties in suppressing harmonics in carrier aggregation applications.

FIG. 1 is a schematic diagram of a radio frequency (RF) system 10 that includes a tunable notch filter 12 according to an embodiment. RF systems discussed herein can be configured to process radio frequency signals having a frequency in a range from about 30 kHz to 300 GHz, such as in a range from about 450 MHz to 6 GHz. As illustrated, the RF system 10 includes a tunable notch filter 12, an antenna switch 14, a filter 16, a control circuit 18, and an antenna 19 arranged to transmit and receive RF signals. An antenna switch module can include the antenna switch 14 and control circuitry associated with the antenna switch 14. The antenna switch module can include the tunable notch filter 12 integrated with the antenna switch 14. The tunable notch filter 12 and the antenna switch 14 can be included within a common package. The antenna switch 14 and at least a portion of the tunable filter 12 can be implemented on a common semiconductor die.

The antenna switch 14 has multiple throws. The antenna switch 14 can include 8 or more throws in certain embodiments. For instance, the antenna switch 14 can include 10 to 12 throws in some embodiments. The antenna switch 14 includes a plurality of input/output (I/O) ports I/O PORT$_1$ to I/O PORT$_N$ and a common port COMMON PORT. An I/O port can serve as an input port, an output port, or an input and output port. For instance, an I/O port can serve as an input of the antenna switch 14 for a transmission path and an output of the antenna switch 14 for a receive path. The antenna switch 14 can electrically connect a selected I/O port to the common port. For instance, FIG. 1 illustrates a first I/O port I/O PORT$_1$ electrically connected to the common port COMMON PORT. The antenna switch 14 can activate a throw to electrically connect an I/O port to the common port.

The filter 16 is in a signal path between the common port of the antenna switch 14 and the antenna 19. The filter 16 can provide any suitable filtering. In certain embodiments, the filter 16 is a low pass filter.

As illustrated in FIG. 1, the tunable notch filter 12 is in series with the filter 16 in the signal path between the common port of the antenna switch 14 and the antenna 19. The illustrated tunable notch filter 12 includes a series resonant circuit in parallel with a tunable impedance circuit. As illustrated, the series resonant circuit is a series LC circuit that includes a capacitor $C_S$ in series with an inductor $L_S$. The tunable impedance circuit can be a tunable capacitance circuit $C_T$. The series LC circuit can effectively short the tunable impedance circuit at a frequency of a radio frequency signal propagating between the common port of the antenna switch 14 and the antenna 19. The series LC circuit can be inductive at frequencies above a resonant frequency of the series LC circuit, and the series LC circuit can create a parallel resonance with the tunable impedance circuit to provide a notch of the tunable notch filter 12. The tunable notch filter 12 can provide a notch at a harmonic, such as a second harmonic, of the radio frequency signal propagating between the common port of the antenna switch 14 and the antenna 19.

While the tunable notch filter 12 shown in FIG. 1 includes a series LC circuit in parallel with a tunable capacitance circuit, other suitable tunable notch filter topologies are possible. Other tunable notch filter circuit topologies can include any other suitable passive impedance network that includes passive impedance elements in series and/or parallel with each other. For instance, the illustrated tunable capacitance circuit $C_T$ can be implemented by a tunable LC circuit or a tunable RC circuit in certain applications.

The antenna switch 14 can be configurable into states in which a selected throw is activated to electrically connect a selected I/O port to the common port. The other throws can be deactivated while the selected throw is activated. In different states of the antenna switch 14, different I/O ports are electrically connected to the common port of the antenna switch 14. Two or more different I/O ports can be associated with different frequency bands. The control circuit 18 can tune the tunable impedance circuit such that a desired impedance is in parallel with the series LC circuit. For instance, the control circuit 18 can tune the tunable impedance circuit so as to provide a notch for a frequency band associated with an I/O port of the antenna switch 14 that is selected.

Figure 2A:
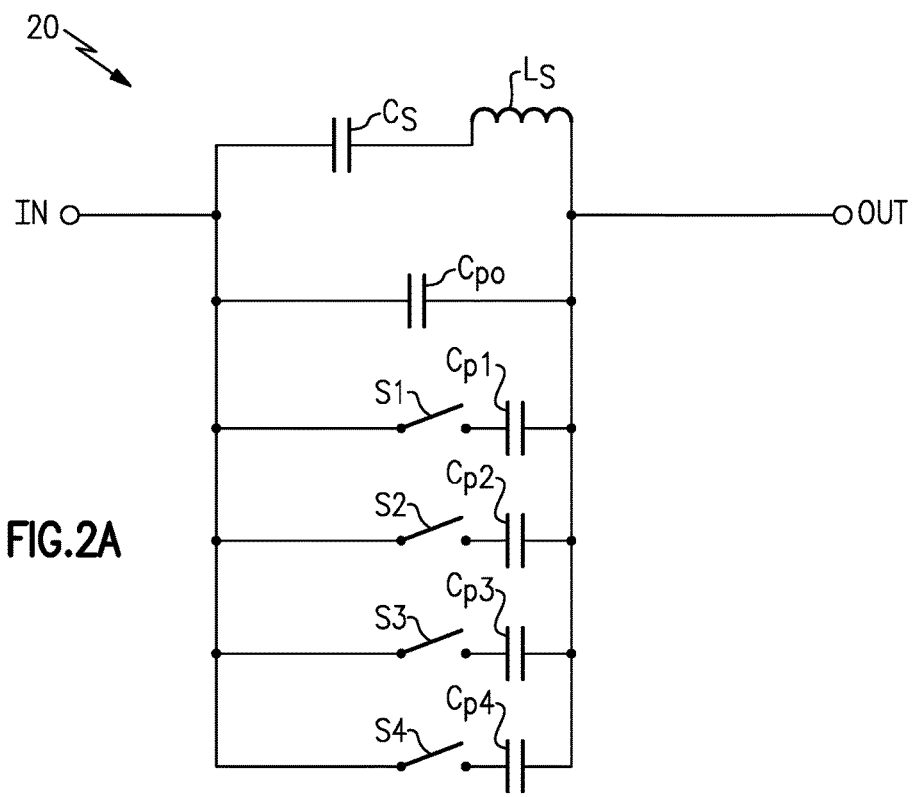
FIG. 2A is a schematic diagram of a tunable notch filter according to an embodiment.

FIG. 2A is a schematic diagram of a tunable notch filter 20 according to an embodiment. The tunable notch filter 20 is an example of the tunable notch filter 12 of FIG. 1. As illustrated, the tunable notch filter 20 includes a series LC circuit in parallel with a tunable capacitance circuit. The series LC circuit includes a capacitor $C_S$ in series with an inductor $L_S$ between an input port IN and an output port OUT. The tunable notch filter 20 can filter signals propagating from the input port IN to the output port OUT and/or signals propagating from the output port OUT to the input port IN. The tunable capacitance circuit includes a plurality of switches S1 to S4 each in series with a respective capacitor $C_{P1}$ to $C_{P1}$. The switches S1 to S4 can adjust the capacitance of the tunable capacitance circuit by switching-in mod/or switching-out respective capacitors $C_{P1}$ to $C_{P4}$ to adjust an amount of capacitance coupled in parallel with a fixed capacitor $C_{P0}$ that is in parallel with the series LC circuit. In some other embodiments, switches can be implemented on opposing sides of a capacitor of the tunable capacitance circuit.

Figure 2B:
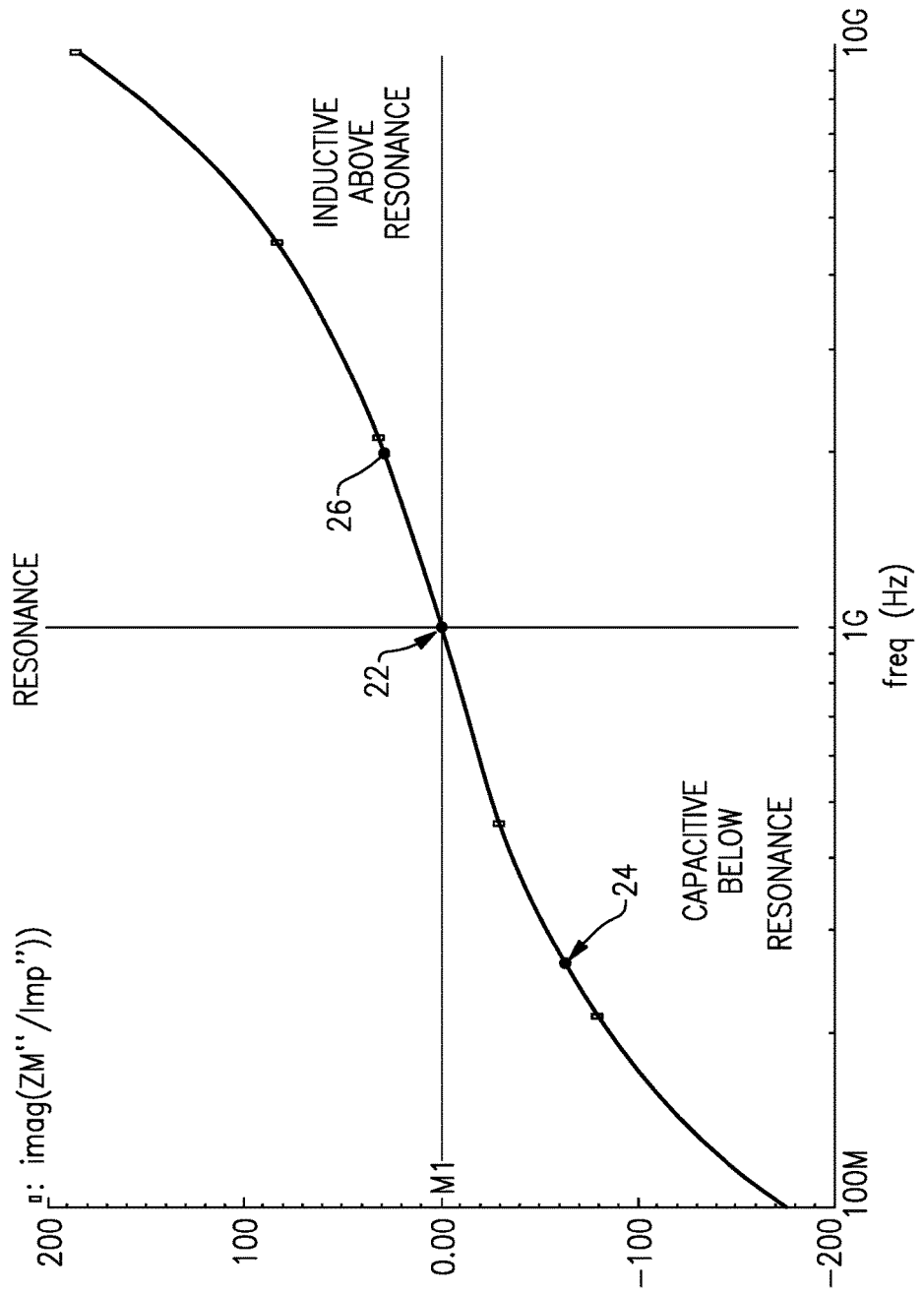
FIG. 2B is a graph showing a relationship of impedance versus frequency for the notch filter of FIG. 2A.

FIG. 2B is a graph showing a relationship of impedance versus frequency for the notch filter 20 of FIG. 2A. The graph of FIG. 2B plots the impedance of the series LC circuit of the tunable notch filter 20 over frequency. This graph shows that the series LC circuit can resonate at a frequency located at point 22 corresponding to a frequency of a carrier. This can effectively short the input port IN of the tunable notch filter 20 to the output port OUT of the tunable notch filter 20 at the frequency of the carrier. In the graph of FIG. 2B, the resonant frequency of the series LC circuit is about 1 GHz. The capacitance of the capacitor Cs and the inductance of the inductor Ls can be selected such that the series LC circuit can have any suitable resonant frequency. According to certain implementations, the resonant frequency of the series LC circuit can be in a range from about 700 MHz to 900 MHz. In some implementations, the capacitance of the capacitor $C_S$ can be in a range from around 7 pF to 10 pF and the inductance of the inductor $L_S$ can be in a range from around 2 nH to 4 nH.

As shown in FIG. 2B, at points on the illustrated curve below the resonant frequency of the series LC circuit (e.g., at point 24), the impedance of the series LC circuit can be capacitive. As also shown in FIG. 2B, at points on the illustrated curve above the resonant frequency of the series LC circuit (e.g., at point 26 at a second harmonic of the resonant frequency), the impedance of the series LC circuit can be inductive. For example, at point 26, the effective inductance of the series LC circuit can be around a few nanohenries.

Figure 2C:
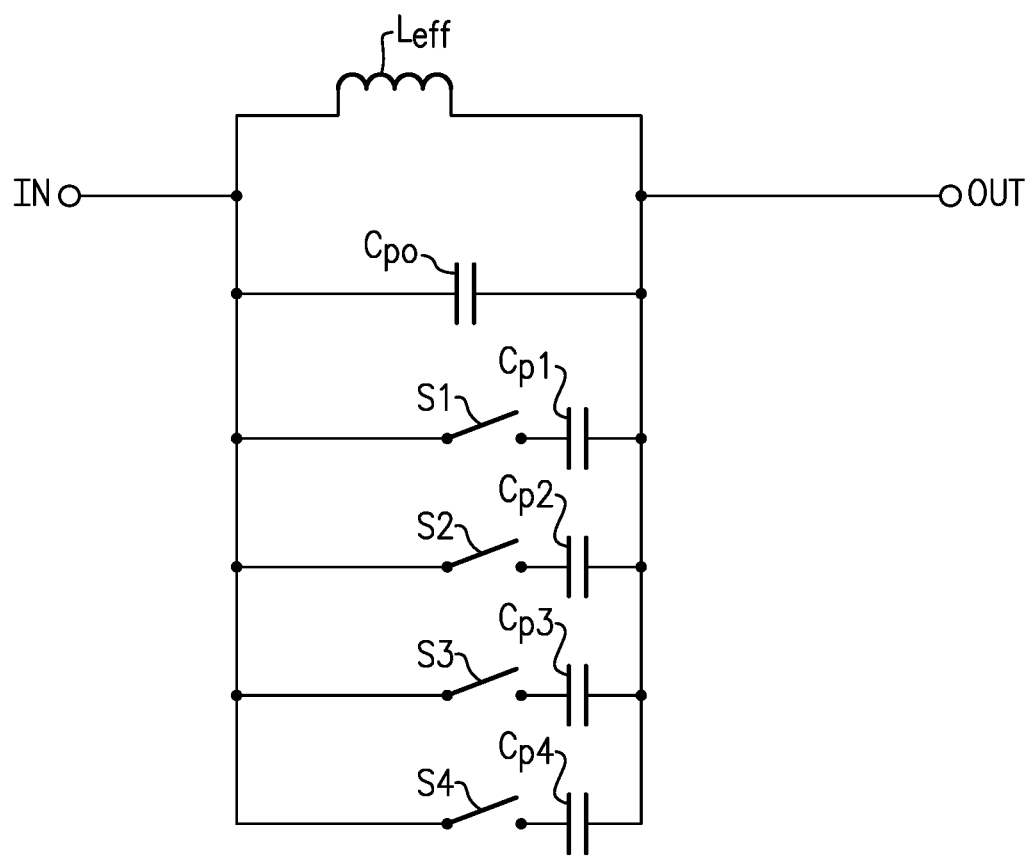
FIG. 2C is schematic diagram illustrating that a series LC circuit of the notch filter of FIG. 2A is inductive at a relatively high frequency.

FIG. 2C is a schematic diagram illustrating that a series LC circuit of the notch filter of FIG. 2A is inductive at a frequency above the resonant frequency of the series LC circuit. As shown in FIG. 2B, the series LC circuit of the tunable notch filter 20 of FIG. 2A can have an inductive impedance at frequencies above the resonant frequency of the series TX circuit (e.g., at point 26 on the graph of FIG. 2B). FIG. 2C illustrates that the series LC circuit of the notch filter can behave as an inductance $L_{EFF}$ at frequencies above the resonant frequency of the series LC circuit.

Figure 2D:
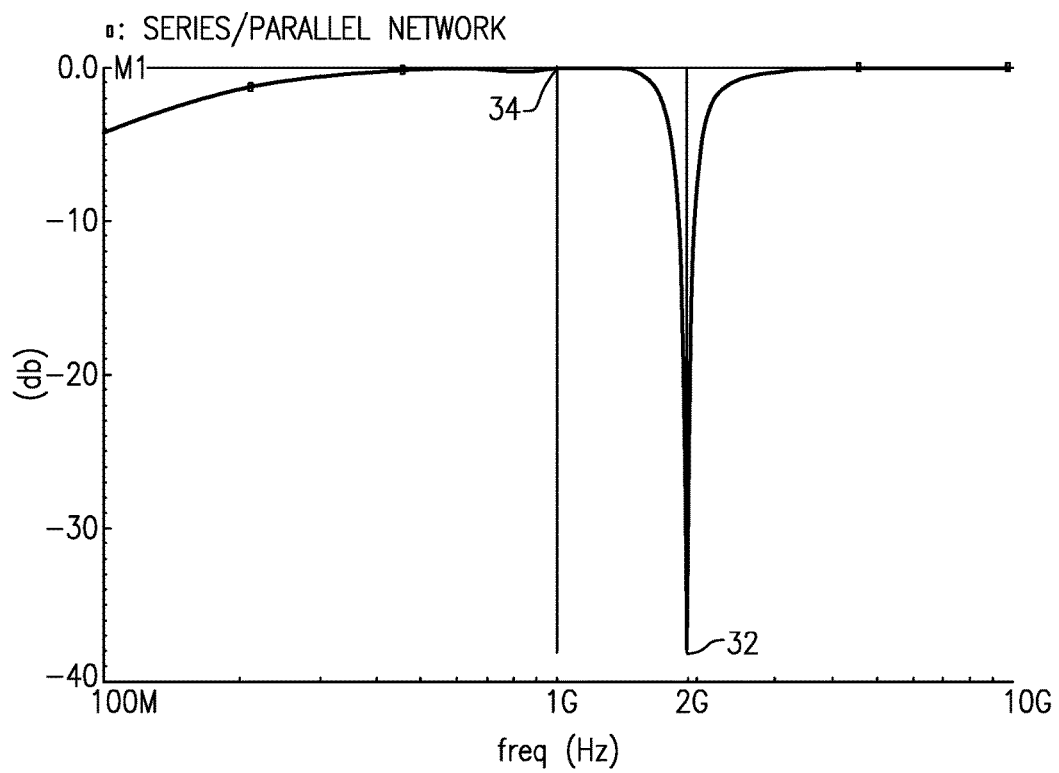
FIG. 2D is a graph illustrating a relationship of impedance versus frequency associated with the tunable notch filter of FIG. 2C.

In the tunable notch filter 20, the tunable capacitance circuit in parallel with the series LC circuit can provide harmonic rejection. The frequency at which harmonic rejection is provided can be tuned by adjusting the capacitance of the tunable capacitance circuit. FIG. 2D is a graph illustrating a relationship of impedance versus frequency associated with the tunable notch filter of FIG. 2C. The impedance in this graph represents a series/parallel frequency response of the tunable notch filter. FIG. 2D shows that the tunable notch filter 20 can provide rejection at second harmonic of a carrier and that there is a low loss at the frequency of the carrier. In particular, at point 32 of the illustrated curve, a parallel resonance of the inductive impedance $L_{EFF}$ of the series LC circuit and a tuned capacitance provide rejection. The frequency at which harmonic rejection is provided can be at a second harmonic of a carrier, for example. Additionally, at point 34 on the illustrated curve, a low loss can be achieved at the frequency of the carrier.

Figure 2E:
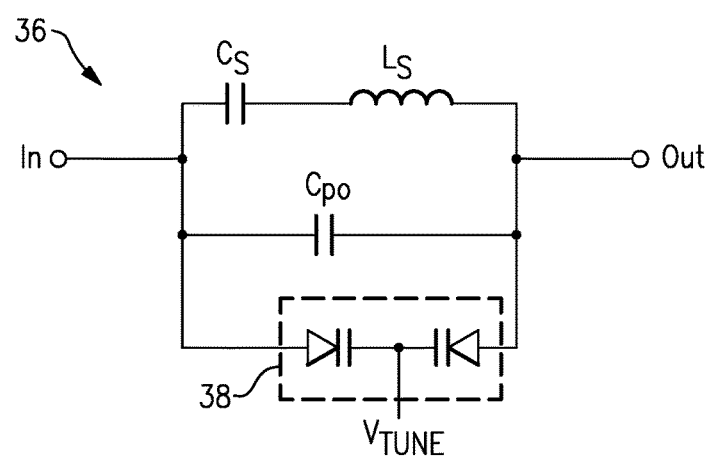
FIG. 2E is a schematic diagram of a tunable notch filter according to another embodiment.

FIG. 2E is a schematic diagram of a tunable notch filter 36 according to another embodiment. The tunable notch filter 36 is an example of the tunable notch filter 12 of FIG. 1. As shown in FIG. 2E, the tunable notch filter 26 includes a tunable capacitance circuit 38 that includes varactors. A tuning voltage $V_{TUNE}$ can be applied to the varactors to adjust capacitance in with parallel with a series LC circuit.

Varactors can have a higher Q factor than some other tunable capacitance circuits. A servo loop can be implemented in connection with a varactor based tunable capacitance circuit to compensate for temperature dependence of varactors. In some other embodiments, a tunable capacitance circuit can include a different number of varactors, a tunable microelectromechanical systems (MEMS) capacitor, or any other suitable variable capacitance circuit.

Figure 3A:
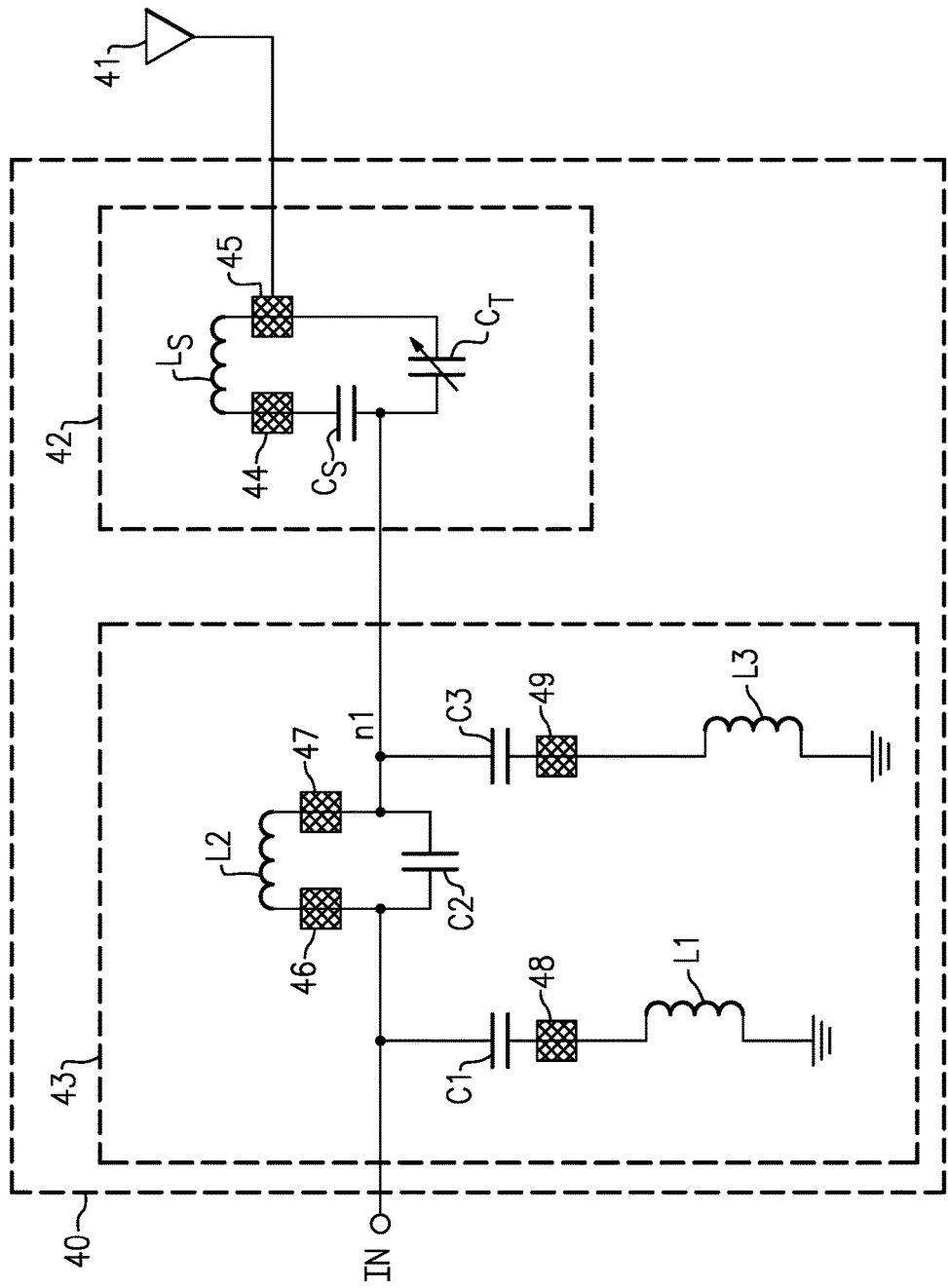
FIG. 3A is a schematic diagram of antenna filters including a tunable antenna filter according to an embodiment.

FIG. 3A is a schematic diagram of an antenna filter assembly 40 that includes a tunable notch filter 42 according to an embodiment. The antenna filter assembly 40 can be coupled between an antenna switch and an antenna 41. The tunable notch filter 42 is an example of the tunable notch filter 12 of FIG. 1. Any of the principles and advantages of the tunable notch filter 42 can be implemented in connection with any of the tunable notch filters discussed herein. The illustrated antenna filter assembly 40 includes the tunable notch filter 42 and a low pass filter (LPF) 43.

Some elements of the illustrated antenna filter assembly 40 can be implemented on a semiconductor die, such as a silicon-on-insulator die, and other elements of the antenna filter assembly 40 can be implemented external to the semiconductor die. For instance, capacitors and switches can be implemented on the semiconductor die and inductors can be implemented external to the semiconductor die. The semiconductor die includes contacts (e.g., pins, bumps, pads such as wire bond pads, or the like) to provide electrical connections between circuit elements on the semiconductor die and circuit elements external to the die. As illustrated in FIG. 3A, the semiconductor die includes contacts 44 and 45 associated with the tunable notch filter 42 and contacts 46, 47, 48, and 49 associated with the LPF 43. Any suitable electrical connector can be implemented between a contact of the semiconductor die and an element of the antenna filter assembly 40 implemented external to the semiconductor die. For instance, an inductor can be electrically connected to a contact of the die by way of a conductive trace, a wire bond, the like, or any suitable combination thereof.

The illustrated LPF 43 is arranged as an elliptical filter. An elliptical filter can exhibit equalized ripple responses in both the pass band and the stop band, and can thus provide rejection relatively near and about the resonant frequency to create a stop band which can suppress undesired signals that may occur. An elliptical filter can be desirable for providing harmonic frequency traps while also providing relatively low insertion loss in the pass band. The illustrated LPF 43 can operate as an elliptical filter to provide a third harmonic frequency trap and has a notch at about 5 GHz.

The LPF 43 includes an inductor L1 and a capacitor C1 connected between the I/O port I/O and ground. The inductor L1 and the capacitor C1 are electrically connected by way of the contact 48. The inductor L1 and the capacitor C1 can have impedances selected so as to absorb an off state capacitance associated with an antenna switch. The capacitance of the capacitor C1 of the LPF 43 can be in parallel with parasitic capacitance of a multi-throw switch of an antenna switch module. Accordingly, the capacitance of C1 can be reduced by the amount corresponding to a parasitic capacitance of the multi-throw switch of the antenna switch module. By arranging C1 in parallel with parasitic capacitance of the multi-throw switch, the physical size of C1 can be reduced. Series capacitors can be used to implement one or more of the capacitors in the antenna filter assembly 40. This can limit voltage across a particular capacitor.

The LPF 43 also includes a parallel LC circuit that includes a capacitor C2 in parallel with an inductor L2. The parallel LC circuit is coupled in series between the I/O port I/O and the tunable notch filter 42. The parallel LC circuit can provide an open circuit at the third harmonic of an RF signal propagating between the I/O port I/O and the antenna 41 and an impedance match at the fundamental frequency of the RF signal. The capacitance of the capacitor C2 and the inductance of the inductor L2 can be selected so as to achieve this functionality. As illustrated, the capacitor C2 is electrically coupled in parallel with the inductor L2 by way of contacts 46 and 47.

The LPF 43 also includes an inductor L3 and a capacitor C3 connected between an internal node n1 and ground. The capacitor C3 is electrically connected to the inductor L3 by way of contact 49. The capacitor C3 and the inductor L3 can provide a notch at approximately 5 GHz. This can filter out a Wi-Fi signal having a frequency of approximately 5 GHz. The capacitance of the capacitor C3 and the inductance of the inductor L3 can be selected so as to achieve a notch at 5 GHz. In some other embodiments, the series LC circuit that includes the inductor L3 and the capacitor C3 can provide a notch at a different selected frequency.

As shown in FIG. 3A, the tunable notch filter 42 includes an inductor $L_S$, a capacitor $C_S$ in series with the inductor $L_S$, and a tunable capacitance circuit $C_T$. As illustrated, the series inductor L2 has a first end electrically connected to the capacitor $C_S$ by way of contact 44 and a second end electrically connected to the tunable capacitance circuit $C_T$ by way of the contact 45. A first terminal of the series capacitor $C_S$ and a first terminal of the tunable capacitance circuit $C_T$ are connected to the internal node n1 in FIG. 3A. As shown in FIG. 3A, the series inductor $L_S$ is connected between a second terminal of the series capacitor $C_S$ and a second terminal of the tunable capacitance circuit $C_T$ by way of contacts 44 and 45, respectively. The antenna 41 is also connected to the contact 45 in FIG. 3A. The tunable capacitance circuit $C_T$ can be implemented in accordance with any of the principles and advantages of any of the tunable capacitance circuits discussed herein, such as the tunable capacitance circuit of FIG. 2A.

The illustrated tunable notch filter 42 can provide second harmonic rejection. Implementing a series LC circuit, such as the series LC circuit formed by the series inductor Ls and the series capacitor $C_S$, in parallel with a tunable capacitance circuit $C_T$ can limit the signal swing across tuning switches of the tunable capacitance circuit $C_T$. For instance, less than about 1.4 Volts peak signal is present across switches of the tunable capacitance circuit $C_T$ in certain embodiments. According to some embodiments, less than about 1 Volt peak signal is present across switches of the tunable capacitance circuit $C_T$. Switches of the tunable capacitance circuit $C_T$ can regenerate harmonics in a large signal environment and limit the effective harmonic floor of the system. By limiting the voltage swing across the switches of the tunable capacitance circuit $C_T$, the harmonic floor of the system can be improved.

Figure 3B:
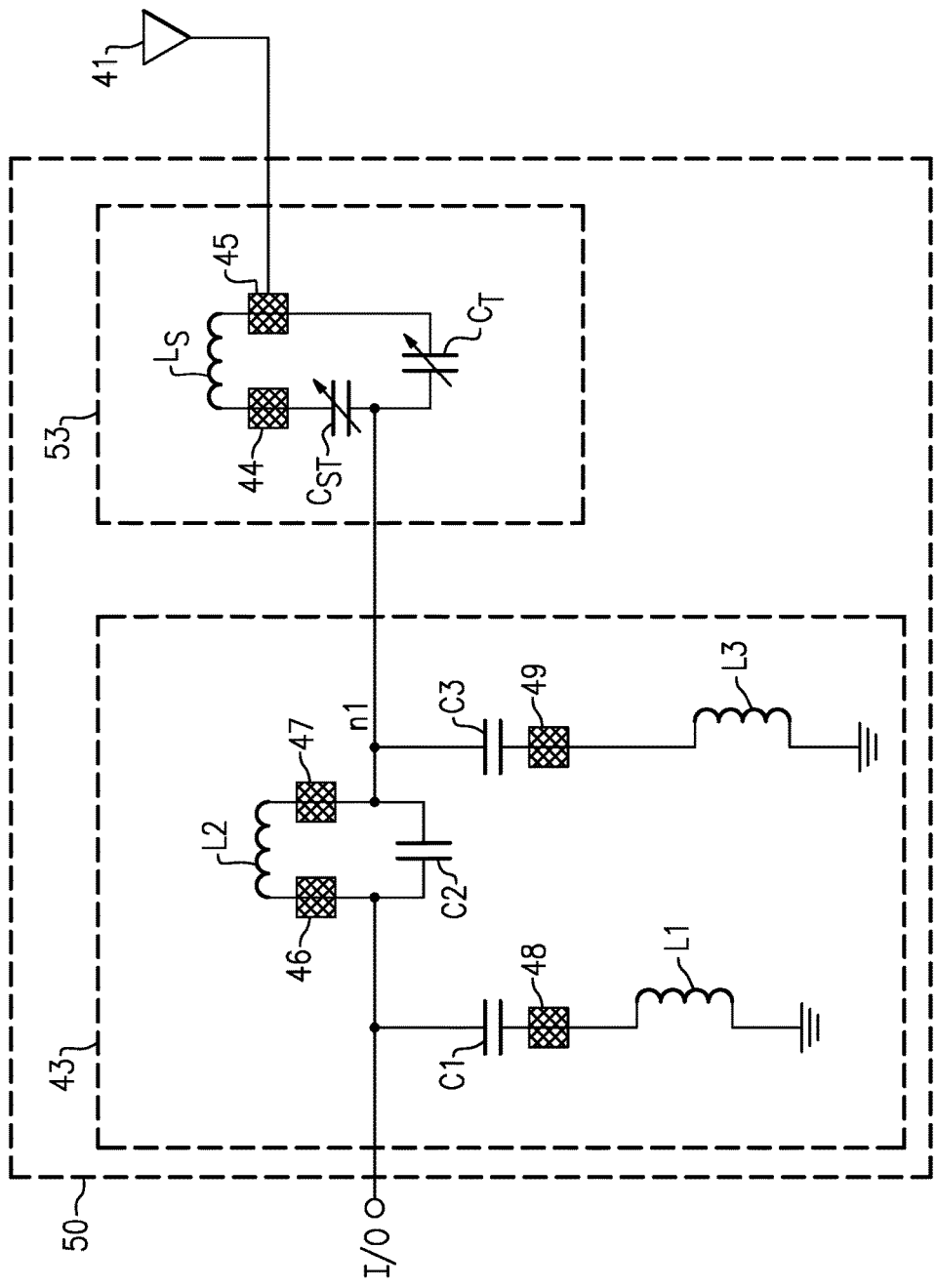
FIG. 3B is a schematic diagram of antenna filters including a tunable antenna filter according to another embodiment.

FIG. 3B is a schematic diagram of an antenna filter assembly 50 including a tunable antenna filter 42 according to another embodiment. The filter assembly 50 is like the filter assembly 40 except that the series capacitor $C_S$ of the tunable notch filter 42 of FIG. 3A is replaced by a tunable capacitance circuit $C_{ST}$ in the tunable notch filter 53 of FIG. 3B. With the tunable capacitance circuit $C_{ST}$, the tunable notch filter 53 can adjust a frequency at which the series LC circuit that includes the tunable capacitance circuit $C_{ST}$ and the inductor $L_S$ resonates. This can also adjust the frequency at which the series LC circuit behaves as an inductive impedance instead of a capacitive impedance. In certain embodiments, the tunable capacitance circuit $C_{ST}$ can be implemented such that it adds less than about 0.5 dB of insertion loss relative to the capacitor $C_S$ of FIG. 3A. The tunable capacitance circuit $C_{ST}$ can be implemented in accordance with any of the principles and advantages of any of the tunable capacitance circuits discussed herein.

Figure 4:
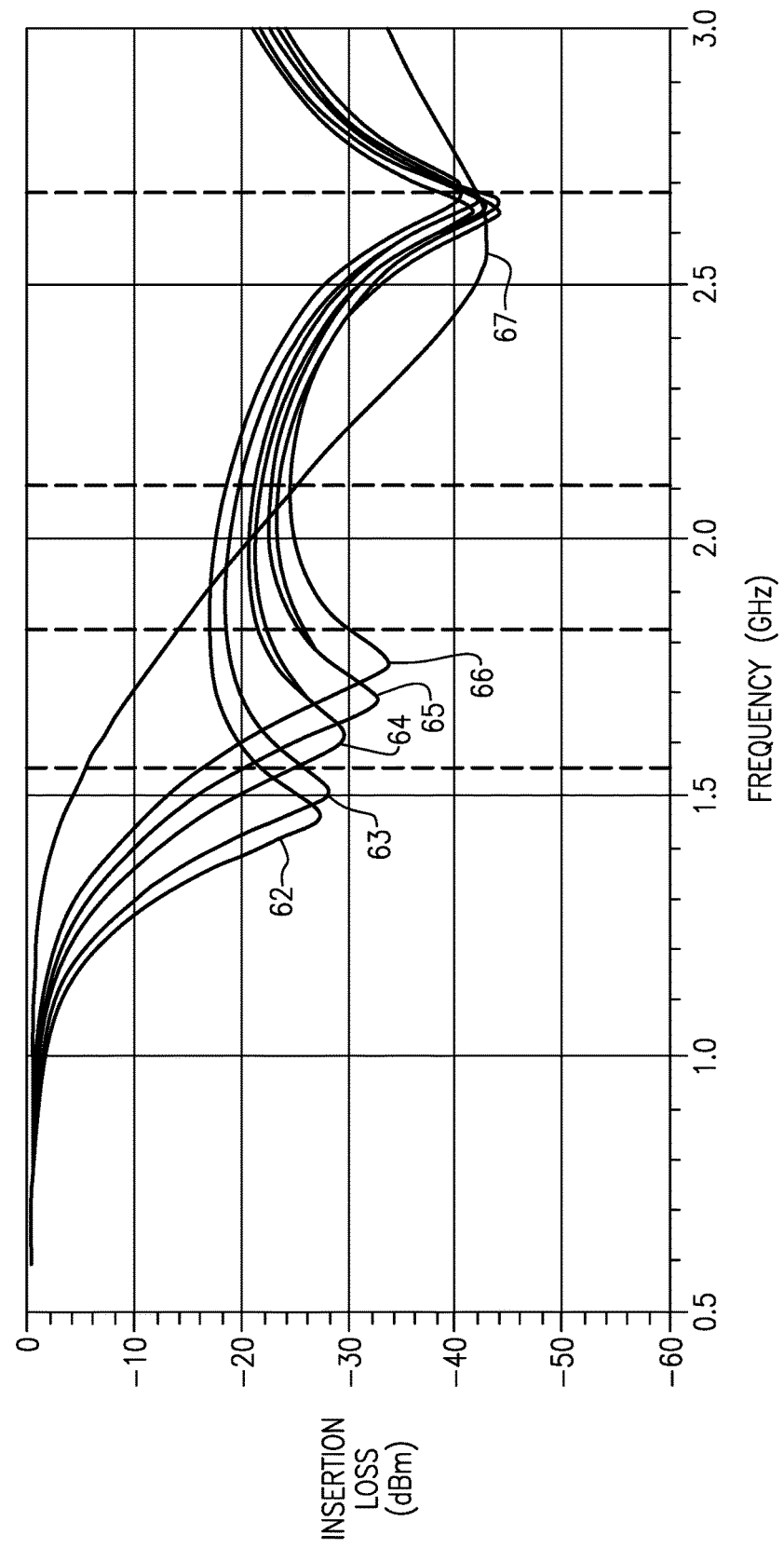
FIG. 4 is a graph showing plots of insertion loss versus frequency for a tunable antenna filter according to an embodiment.

FIG. 4 is a graph showing plots of insertion loss versus frequency for a tunable antenna filter according to an embodiment. This graph includes curves corresponding to selected antenna switch module signal paths illustrating insertion loss associated with states of the tunable notch filter 42 of FIG. 3A. A notch at the second harmonic can be tuned by adjusting capacitance in a tunable capacitance circuit that is in parallel with a series LC circuit based on a selected antenna switch module signal path. Any suitable control circuit, such as the control circuit 18 of FIG. 1, can tune the tunable capacitance circuit. The curve 62 corresponds to Long Term Evolution (LTE) Band 12 and has a notch that is at a frequency between 1.4 GHz and 1.5 GHz. The curve 63 can correspond to LTE Band 13 and has a notch around 1.5 GHz. Curves 64, 65, and 66 correspond to LTE Bands 26, 20, 8, respectively, and have notches at the second harmonics for respective frequency bands. Curve 67 corresponds to LBDIV.

Figure 5:
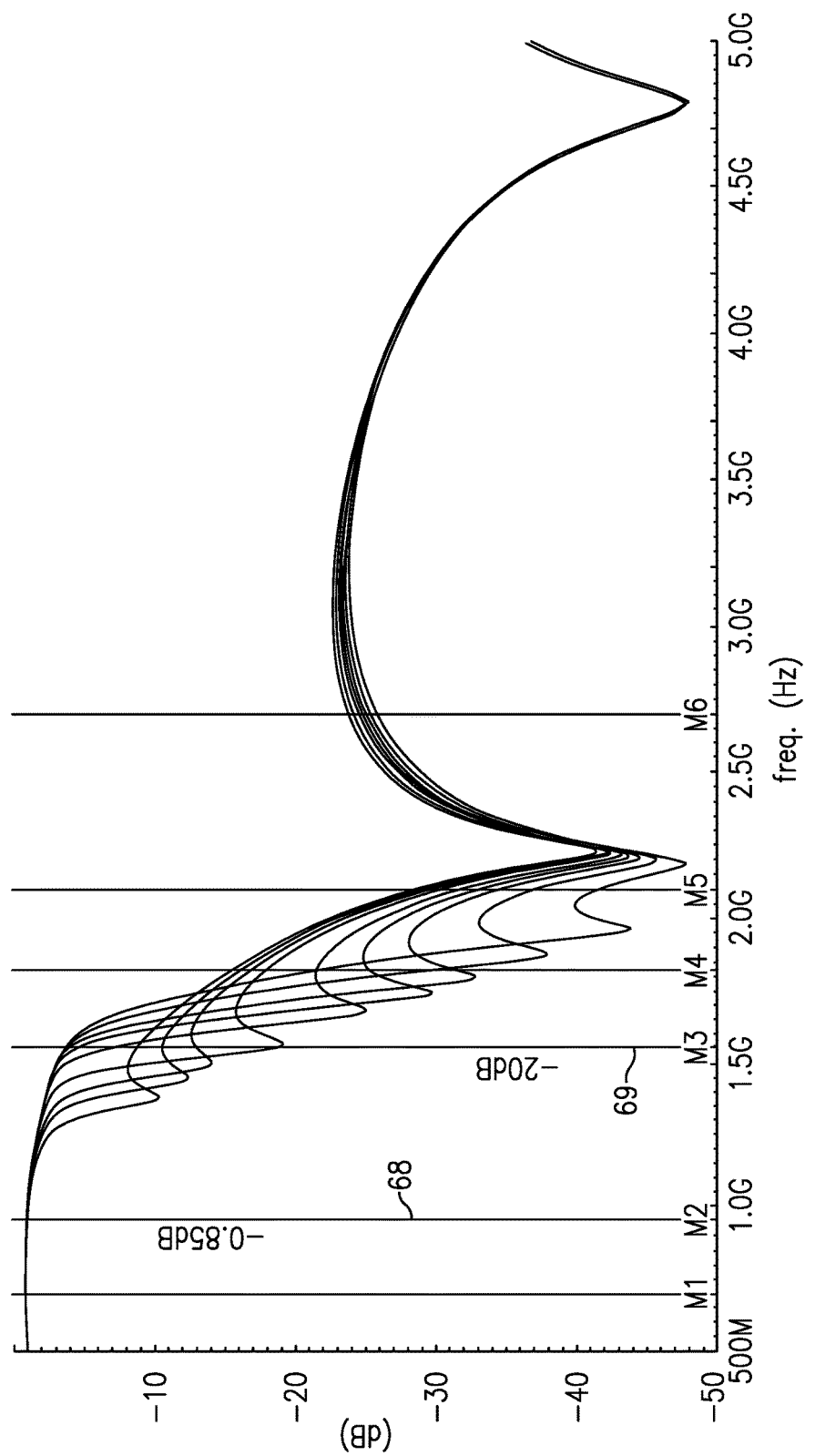
FIG. 5 is a graph showing plots of filter response versus frequency for a tunable antenna filter according to an embodiment.

FIG. 5 is a graph showing plots of filter response versus frequency for a tunable antenna filter according to an embodiment. This graph shows curves illustrating frequency responses of states of the tunable notch filter 42 of FIG. 3A. These curves indicate that notch depth decreases as the notch frequency gets closer to the passband. The edge of the passband can be indicated by the vertical line 68 at frequency M2. An example of notch depth is shown by vertical line 69 at frequency M3 where the notch depth has approximately −20 dB of attenuation. As shown in FIG. 5, the tunable notch filter 42 can have more than 20 dB of rejection for notches at frequencies above 1.5 GHz.

Figure 6:
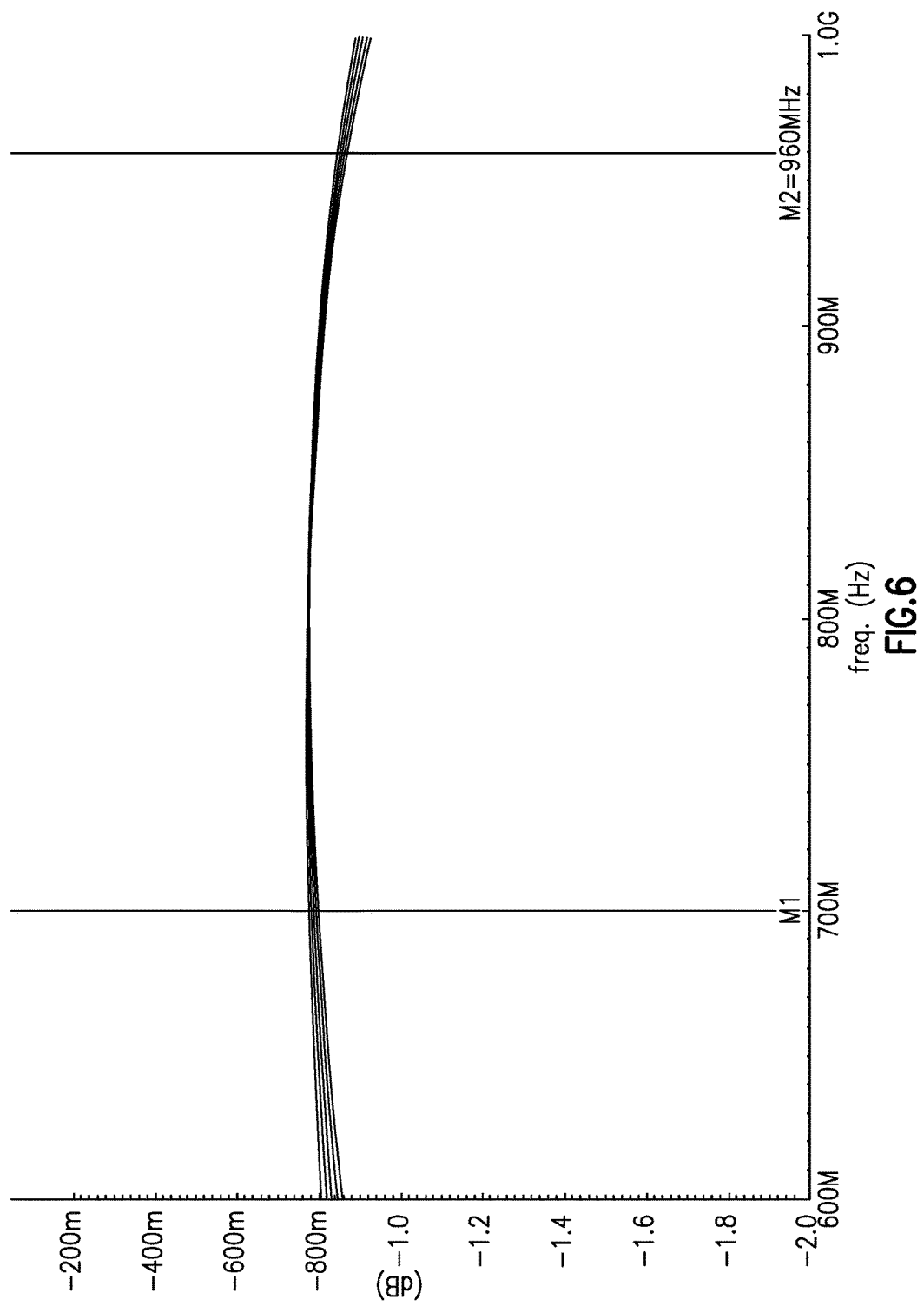
FIG. 6 is a graph showing plots of insertion loss versus frequency for an antenna switch and a tunable antenna filter according to an embodiment.

FIG. 6 is a graph showing plots of insertion loss versus frequency for an antenna switch and a tunable antenna filter according to an embodiment. This graph plots insertion loss versus frequency for an antenna switch module and the antenna filter assembly 40 of FIG. 3A. The plots indicate that there is less than 1 dB of insertion loss at 960 MHz independent of the state of the tunable notch filter.

The series LC circuit of tunable notch filters discussed herein can experience process variations. The capacitance of the capacitor $C_S$ of the series LC circuit can vary from die to die. Alternatively or additionally, the inductance of the inductor $L_S$ of the series LC circuit can vary from module to module. Process variations can degrade the effectiveness of a tunable notch filter. To reduce such degradation, trimming can be implemented. Accordingly, a state of tunable impedance circuit of any of the tunable notch filters discussed herein can be set based at least partly on trim data.

Figure 7:
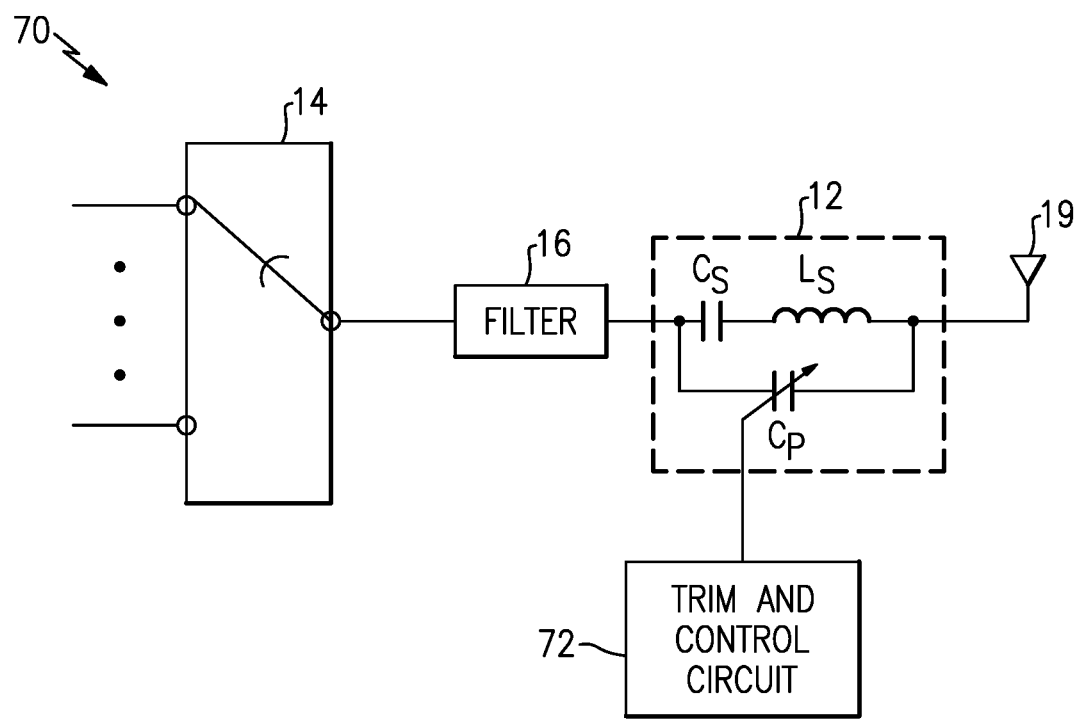
FIG. 7 is a schematic diagram of a radio frequency system that includes a tunable notch filter and a trim and control circuit according to an embodiment.

FIG. 7 is a schematic diagram of a radio frequency system 70 that includes a tunable notch filter 12 and a trim and control circuit 72 according to an embodiment. The radio frequency system 70 is like the radio frequency system 10 of FIG. 1 except that the control circuit 18 of FIG. 1 is replaced by a trim and control circuit 72 in FIG. 7. The trim and control circuit 72 can implement any of the functions for controlling a tunable impedance circuit, such as a tunable capacitance circuit, discussed herein. The trim and control circuit 72 can use trim data to set the state of a tunable impedance circuit. The trim data can represent a process variation associated with one or more circuit elements of the tunable notch filter 12. For instance, the trim data can represent process variation(s) associated with the capacitor $C_S$ and/or the series inductor $L_S$ of the tunable notch filter 12.

The trim data can be used to shift a frequency response of the tunable notch filter so as to compensate for a process variation of one or more circuit elements of the tunable notch filter 12. For instance, using the trim data, the trim and control circuit 72 can compensate for process variations of the series LC circuit of the tunable notch filter 12.

Figure 8:
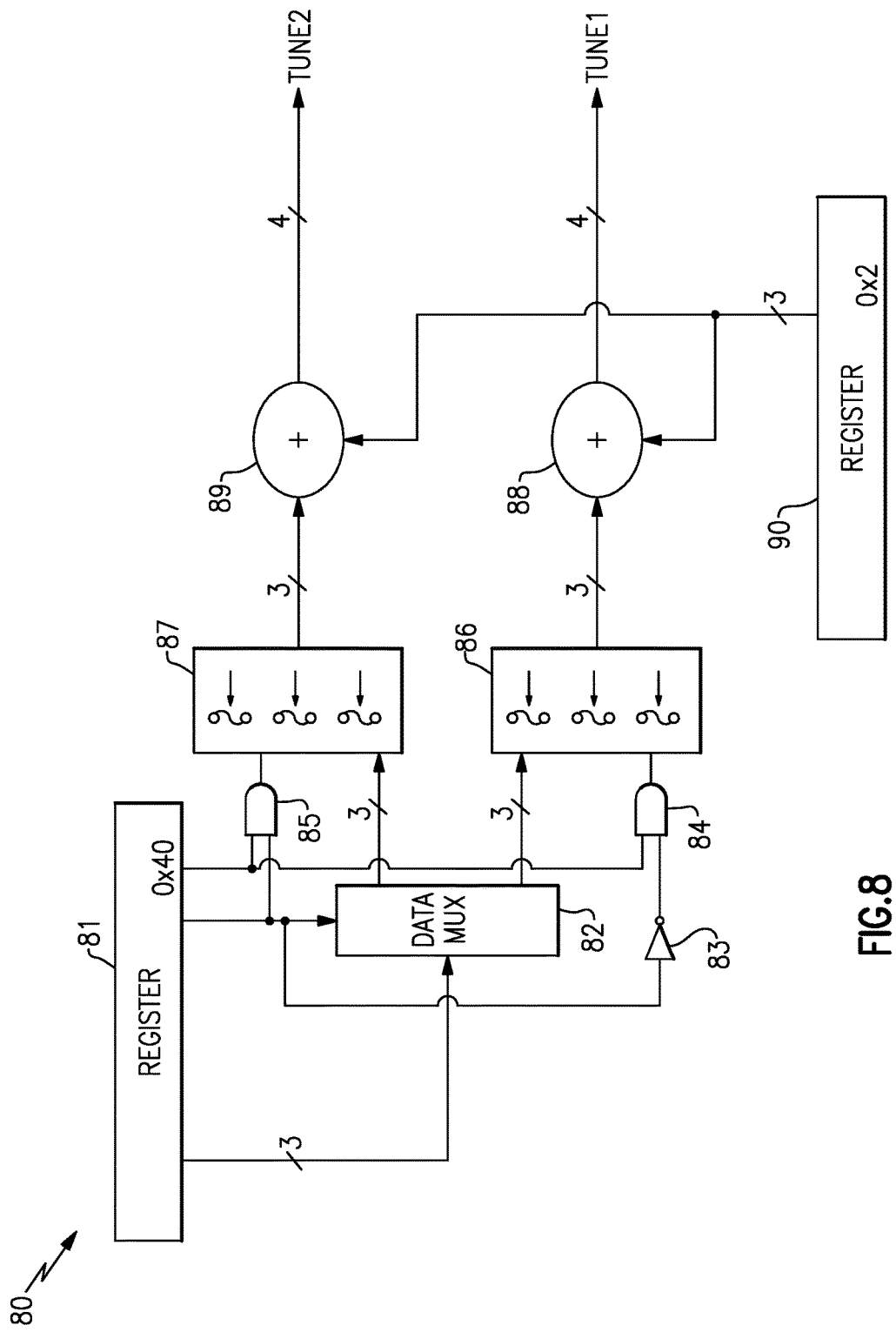
FIG. 8 is a schematic diagram of a trim and control circuit according to an embodiment.

FIG. 8 is a schematic diagram of a trim and control circuit 80 according to an embodiment. The trim and control circuit 80 is an example of the trim and control circuit 72 of FIG. 7 and can be implemented in connection with any of the tunable filters discussed herein. The trim and control circuit 80 can set the state of a tunable impedance circuit, such as the tunable capacitance circuit of the tunable filter 20 of FIG. 2C, based on trim data and tuning state data. A trim and control circuit can implement any suitable number of trim states and any suitable number of notch tuning states.

As illustrated, the trim and control circuit 80 includes a first register 81, a data multiplexer 82, an inverter 83, an AND gate 84, an AND gate 85, a first fuse block 86, a second fuse block 87, a first adder 88, a second adder 89, and a second register 90. The first register 81 can provide signals to the data mux 82 and control logic including the inverter 83 and AND gates 84 and 85 to store the trim data to the first fuse block 86 or the second fuse block 87. The fuse blocks 86 and 87 each include fuse elements (e.g., fuses and/or anti-fuses). In certain implementations, the fuse elements can be implemented using semiconductor-on-insulator, such as silicon-on-insulator technology. Such fuse elements can be implemented by eFUSE technology. According to some other implementations, the trim data can be stored in another suitable type of non-volatile memory.

The illustrated trim and control circuit 80 can set a tunable notch filter into 16 states. Each of the fuse blocks 86 and 87 shown in FIG. 8 is arranged to store 3 bits of trim data. Accordingly, this trim data stored by each fuse block can implement eight process trim states. The second register 90 can provide signals for notch tune states. As illustrated, the second register provides three bits of notch tuning data. Accordingly, this notch tuning data can implement eight notch tuning states. Tuning data can be generated by adding trim data from a fuse block with notch tuning data. By adding the trim data with the notch tuning data, the tuning data can shift a frequency response of the tunable filter by an offset represented by the trim data. This can improve performance of the tunable filter. Adding the trim data with the notch tuning data to generate tuning data can be efficiently implemented without more complicated circuitry such as a multiplier. As shown in FIG. 8, the first adder 88 can add 3 bits of trim data from the first fuse block 86 with 3 bits of notch tuning data from the second register 90 to generate 4 bits first tuning data TUNE1. The 4 bits of first tuning data TUNE1 can set an adjustable impedance circuit of a tunable notch filter into 16 different states. For instance, each bit of the first tuning data TUNE1 can control a switch of the tunable capacitance circuit of the tunable filter 20 of FIG. 2C.

A trim and control circuit can be implemented in connection with any suitable number of tunable notch filters. Any of the principles and advantages discussed herein can be implemented in connection with a device having two or more tunable notch filters. For instance, trim data can be provided to two notch filters. As an example, the two notch filters can be associated with two antennas, such as a primary antenna and a diversity antenna. As shown in FIG. 8, the second adder 89 can add 3 bits of trim data from the second fuse block 87 with 3 bits of notch tuning data from the second register 90 to generate 4 bits second tuning data TUNE2 for a second tunable notch filter associated with a different antenna than the first tuning data TUNE1. Any of the principles and advantages discussed herein can be implemented in connection with a device having two or more antennas.

Figure 9:
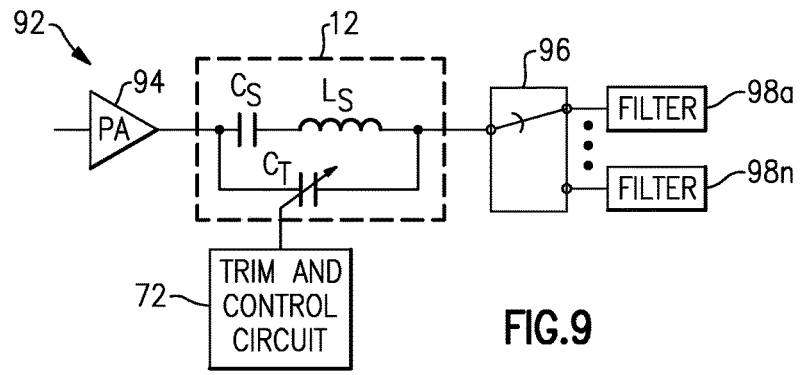
FIG. 9 is a schematic diagram of a radio frequency system with a tunable notch filter according to an embodiment.
Figure 10:
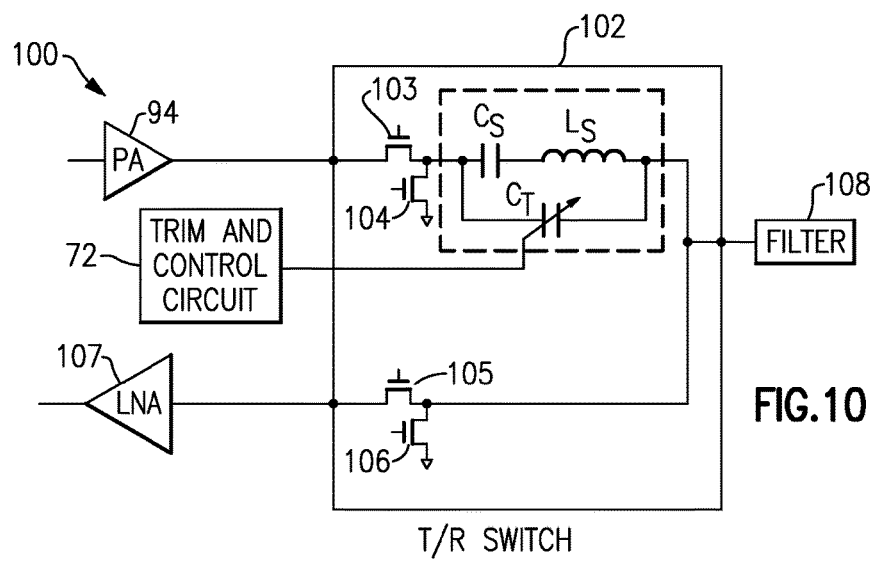
FIG. 10 is a schematic diagram of a radio frequency system with a tunable notch filter according to another embodiment.

Any of principles and advantages of the tunable notch filters discussed herein can be implemented in any suitable application that could benefit from a tunable notch filter, such as applications in which a tunable notch filter is in a radio frequency signal path associated with a common port of a multi-throw switch. For instance, a tunable notch filter can be arranged to filter out harmonics associated with a radio frequency signal amplified by a power amplifier. Such a tunable notch filter can be implemented in a transmit signal path such that the tunable notch filter should not add insertion loss to a receive path. FIGS. 9 and 10 illustrate example radio frequency systems in which a tunable notch filter can filter out a harmonic of an amplified radio frequency signal provided by a power amplifier. Any combination of features of the tunable notch filters discussed herein can be implemented in connection with any suitable principles and advantages discussed with reference to the radio frequency systems of FIGS. 9 and/or 10.

FIG. 9 is a schematic diagram of a radio frequency system 92 with a tunable notch filter 12 according to an embodiment. As illustrated, the RF system 92 includes a tunable notch filter 12, a trim and control circuit 72, a power amplifier 94, a multi-throw switch 96 and filters 98a to 98n. The tunable notch filter 12 of FIG. 9 is in series in a signal path between the power amplifier 94 and a common port of the multi-throw switch 96. The power amplifier 94 can be any suitable power amplifier. For instance, the power amplifier 94 can be arranged to amplify radio frequency signals in a plurality of different frequency bands. An amplified RF signal provided by the power amplifier 94 can have a harmonic frequency component due to non-linearities of a power amplifier transistor. The power amplifier transistor can be, for example, a gallium arsenide (GaAs) transistor, a metal oxide semiconductor (MOS) transistor, or a silicon germanium (SiGe) transistor. Moreover, any of the power amplifiers discussed herein can be implemented by field effect transistors and/or bipolar transistors, such as heterojunction bipolar transistors.

The trim and control circuit 72 can set the state of the tunable notch filter 12 to correspond to a frequency band of radio frequency signal being amplified by the power amplifier. Accordingly, a harmonic frequency component such as a second harmonic of an amplified RF signal provided by the power amplifier 94 can be suppressed by the tunable notch filter 12. The tunability of the tunable notch filter 12 can enable the harmonic frequency components associated with several frequency bands to be selectively filtered out using one filter. This can filter out unwanted harmonics near a source that creates such unwanted harmonics.

The multi-throw switch 96 can selectively electrically couple the output of the power amplifier 94 to a particular filter of the illustrated FIGS. 98a to 98n. The multi-throw switch 96 can be a band select switch and two or more of the filters 98a to 98n can be associated with different frequency bands. The filters 98a to 98n can represent transmit filters of respective duplexers. With the tunable notch filter 12, the filters 98a to 98n can be simplified and/or have less stringent specifications due to notch filtering in the signal path from the output of the power amplifier 94 to the common port of the multi-throw switch 96. The multi-throw switch 96 can have any suitable number of throws and a corresponding number of filters 98a to 98n can be coupled to I/O ports of the multi-throw switch 96.

FIG. 10 is a schematic diagram of a radio frequency system 100 with a tunable notch filter 12 according to another embodiment. As illustrated, the RF system 100 includes a tunable notch filter 12, a trim and control circuit 72, a power amplifier 94, a multi-throw switch 102 including series switches 103 and 105 and shunt switches 104 and 106, a low noise amplifier 107, and a filter 108. The tunable notch filter 12 of FIG. 10 is in a transmit signal path between the power amplifier 94 and the filter 108. Accordingly, the tunable notch filter 12 should not add insertion loss to the illustrated receive path. The illustrated multi-throw switch 102 is a transmit/receive switch that can selectively electrically connect the filter 108 to either a transmit path or a receive path. The filter 108 can be in a signal path between the common port of the multi-throw switch 102 and an antenna port.

Any of the multi-throw switches discussed herein can include a series switch and a shunt switch for each throw. As shown in FIG. 10, the series switch 103 and the shunt switch 104 implement a first throw the multi-throw switch 102 and the series switch 105 and the shunt switch 106 implement a second throw the multi-throw switch 102. As also shown in FIG. 10, the series switch and the shunt switch for each throw can be implemented by a field effect transistor. In the illustrated electronic system 100, the tunable notch filter can be implemented in a signal path between the series switch 103 of the first throw and the common port of the multi-throw switch 102. Accordingly, the tunable notch filter 12 of FIG. 10 can suppress harmonics from the power amplifier 94 and the series switch 103.

Figure 11A:
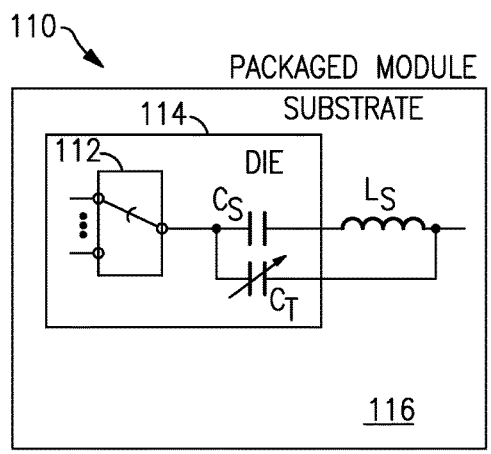
FIG. 11A is a schematic diagram of a packaged module that includes a tunable notch filter according to an embodiment.
Figure 11B:
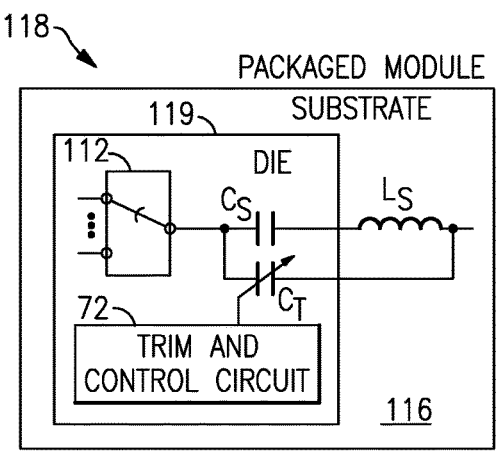
FIG. 11B is a schematic diagram of a packaged module that includes a tunable notch filter according to an embodiment.

FIGS. 11A and 11B are schematic diagrams of illustrative packaged modules. Such packaged modules can include a semiconductor die and one or more passive components on a packaging substrate enclosed within a common package. Some such packaged modules can be multi-chip modules. The semiconductor die can be manufactured using any suitable process technology. As one example, the semiconductor die can be a semiconductor-on-insulator die, such as a silicon-on-insulator die.

FIG. 11A is a schematic diagram of a packaged module 110 that includes a tunable notch filter according to an embodiment. As shown in FIG. 11A, the packaged module 110 can include a semiconductor die 114 and the inductor $L_S$ of a tunable notch filter on a packaging substrate 116. The semiconductor die 114 can include a multi-throw switch 112, the series capacitor $C_S$ of the tunable filter, and the tunable capacitance circuit $C_T$ of the tunable filter. The multi-throw switch 112 can be arranged, for example, as an antenna switch or as a band select switch. The inductor $L_S$ can be implemented as a spiral trace on the packaging substrate 116 or in any other suitable manner to provide desired characteristics for a tunable notch filter.

FIG. 11B is a schematic diagram of a packaged module 118 that includes a tunable notch filter according to an embodiment. The packaged module 118 is like the packaged module 110 except that the semiconductor die 119 of packaged module 118 includes a trim and control circuit 72.

Figure 12:
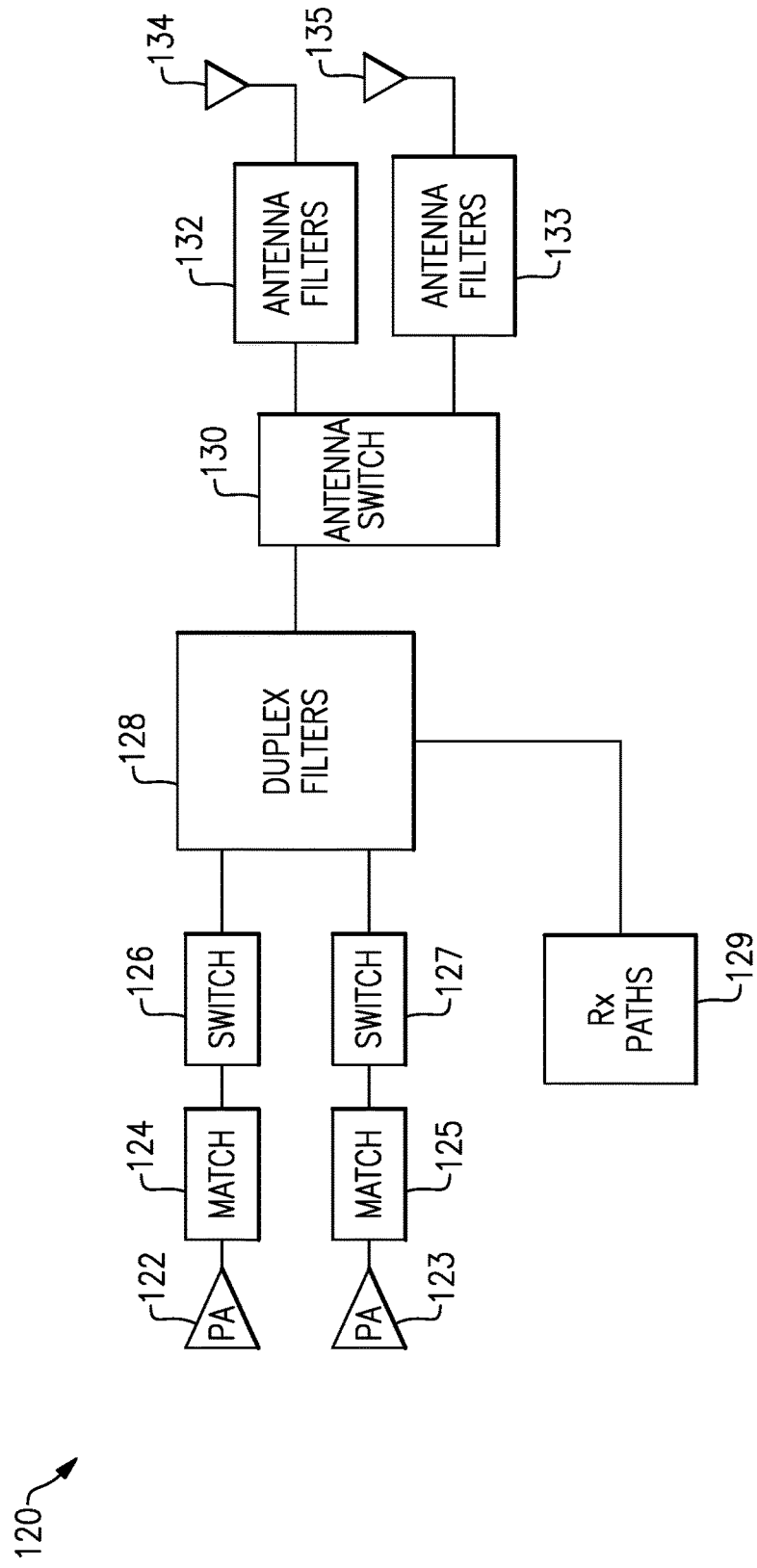
FIG. 12 is a schematic diagram of an RF system according to an embodiment.

FIG. 12 is a schematic diagram of an RF system 120 according to an embodiment. The RF system 120 can be referred to as an RF front end. An RF front end can include circuitry coupled between a baseband processor and an antenna. For instance, an RF front end can include circuitry coupled between a mixer and an antenna. The RF system 120 can include one or more tunable notch filters in accordance with the any principles and advantages discussed herein.

As illustrated, the RF system 120 includes power amplifiers 122 and 123, matching networks 124 and 125, RF switches 126 and 127, duplex filters 128, receive signal paths 129, an antenna switch 130, antenna filters 132 and 133, and antennas 134 and 135. The first power amplifier 122 and the second power amplifier 123 can be associated with different frequency bands and/or different modes of operation. Each of these power amplifiers can amplify RF signals. Matching networks 124 and 125 provide impedance matching for outputs of power amplifiers 122 and 123, respectively, to reduce reflections and to improve signal quality.

In certain embodiments, a tunable notch filter can be implemented in connection with the matching network 124 and/or the matching network 125, for example, as described with reference to FIG. 9. The RF switch 126 can electrically connect the output of the first power amplifier 122 to a selected transmit filter of the duplex filters 128. Similarly, the RF switch 127 can electrically connect the output of the second power amplifier 123 to a selected transmit filter of the duplex filters 128. The RF switch 126 and/or the RF switch 127 can be a multi-throw switch.

The receive paths 129 can include a low noise amplifier and a multi-throw switch to electrically connect the low noise amplifier to a selected receive filter of the duplex filers 128. A tunable notch filter can be coupled between a common port of the multi-throw switch of the receive paths 129 and the low noise amplifier.

An antenna switch 130 can be coupled between the duplex filters 128 and antenna filters 132. The antenna switch 130 can include a multi-throw switch and control functionality to electrically couple a selected duplexer in the duplex filters 128 to the antenna 134. The duplex filters 128 can include a plurality of duplexers. Each of these duplexers can include a transmit filter and a receive filter. The antenna filters 132 are coupled between the duplex filters 128 and a first antenna 134. The antenna 134 can be a primary antenna. The antenna 134 can be an antenna of a mobile device, such as a mobile phone.

The antenna filters 132 can filter radio frequency signals propagating between the antenna switch 130 and the antenna 134. The antenna filters 132 can include a tunable notch filter. Accordingly, the tunable notch filter can filter radio frequency signals propagating between the antenna switch 130 and the antenna 134. The antenna filters 132 can also include another filter, such as a low pass filter, in series with the tunable notch filter in a signal path between the antenna switch 130 and the antenna 134.

The antenna switch 130 can include a multi-throw multi-pole switch, in the RF system 120, the antenna switch 130 includes two poles. The first pole is associated with the first antenna 134 and the second pole is associated with the second antenna 136. The antenna filters 133 can include a tunable notch filter. The antenna filters 133 can include one or more features of the antenna filters 132.

Figure 13A:
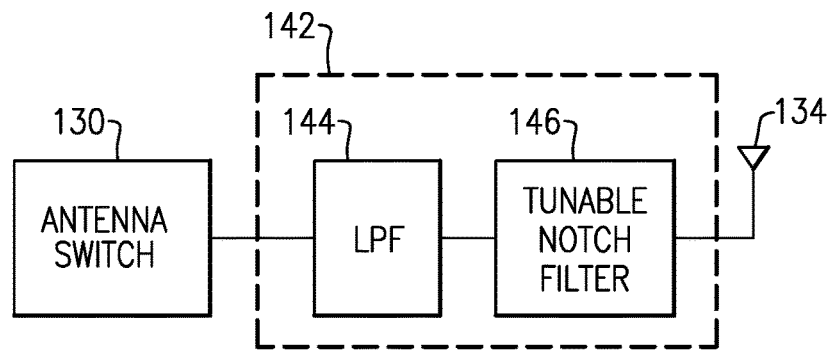
FIG. 13A is a schematic block diagram showing more details of antenna filters according to an embodiment.

FIG. 13A is a schematic block diagram showing more details of antenna filters according to an embodiment. The antenna filters 142 of FIG. 13A are an example of the antenna filters 132 of FIG. 12. The antenna filters 142 can include a notch filter for providing a zero at a second harmonic of a carrier and also provide a frequency trap at third harmonics of the carrier between the antenna switch 130 and the antenna 134. The second harmonic zero can be tuned with the tunable impedance circuit of the tunable notch filter. The antenna filters 142 are coupled between the antenna switch 130 and the antenna 134. As illustrated, the antenna filters 142 include a low pass filter 144 and a tunable notch filter 146. The low pass filter 43 of FIG. 3A is an example of the low pass filter 144. The tunable notch filter 146 implement any of the principles and advantages of the tunable notch filters discussed herein. As shown in FIG. 13A, the tunable notch filter 146 can be in the signal path between the low pass filter 144 and the antenna 134.

Figure 13B:
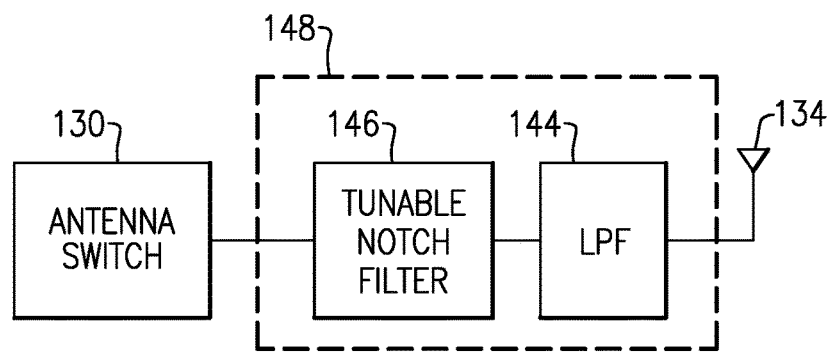
FIG. 13B is a schematic block diagram showing more details of antenna filters according to another embodiment.

FIG. 13B is a schematic block diagram showing more details of antenna filters according to another embodiment. The antenna filters 148 of FIG. 13B are like the antenna filters 144 of FIG. 13A except that the low pass filter 144 is coupled between the tunable notch filter 146 and the antenna 134. As shown in FIG. 13B, the tunable notch filter 146 can be in the signal path between the antenna switch 130 and the low pass filter 144. While FIG. 13A and FIG. 13B illustrate a tunable notch filter 146 in series with a low pass filter 144, a tunable notch filter in accordance with any of the principles and advantages discussed herein can be implemented in series with a band pass filter or a high pass filter in some other embodiments.

Figure 14:
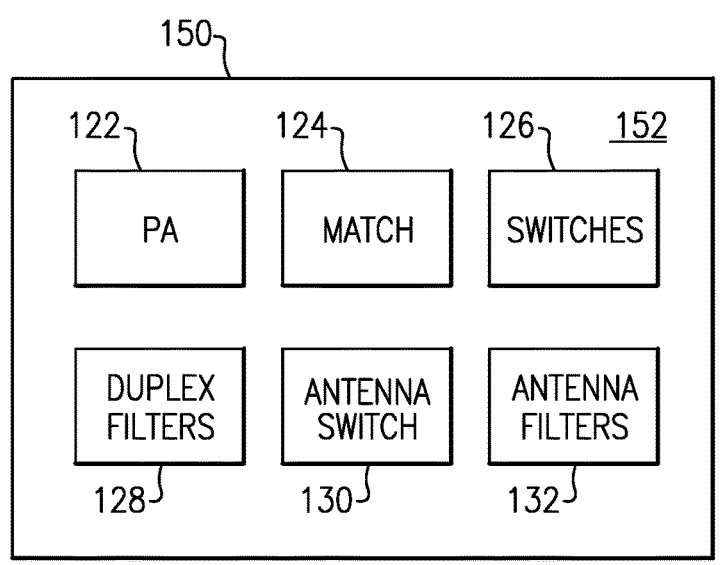
FIG. 14 is a schematic block diagram of a nodule according to an embodiment.

FIG. 14 is a schematic block diagram of a module 150 according to an embodiment. The illustrated module 150 includes a packaging substrate 152 on which a power amplifier 122, a matching network 124, a switch (e.g., a band select switch) 126, duplex filters 128, an antenna switch 130, and antenna filters 132 that include a tunable notch filter are arranged. The illustrated elements can be enclosed within a common package. In some other embodiments, the antenna filters 132 can be implemented in a module and packaged with one or more of the illustrated elements of FIG. 14. Switches of the antenna switch 130 and/or of embodiments of the tunable notch filter of the antenna filters 132 can be implemented in semiconductor-on-insulator technology such as silicon-on-insulator technology.

Figure 15:
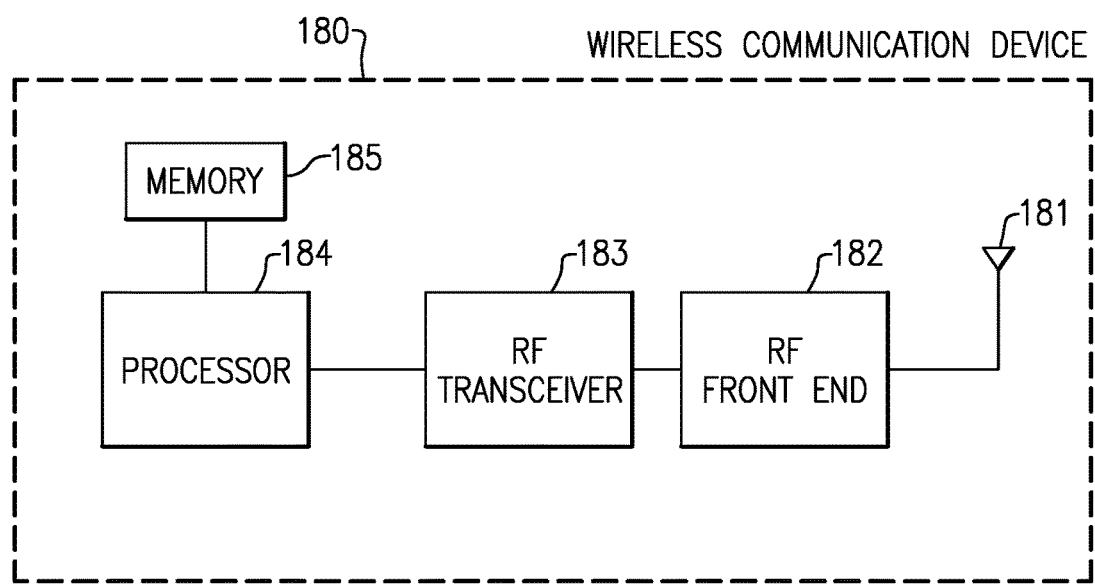
FIG. 15 is a schematic block diagram of a wireless communication device according to an embodiment.

FIG. 15 is a schematic block diagram of illustrative wireless communication device 180 that includes a tunable notch filter in accordance with one or more embodiments. The wireless communication device 180 can be any suitable wireless communication device. For instance, a wireless communication device 180 can be a mobile phone, such as a smart phone. As illustrated, the wireless communication device 180 includes an antenna 181, an RF front end 182, an RF transceiver 183, a processor 184, and a memory 185. The antenna 181 can transmit RF signals provided by the RF front end 182. The antenna 181 can provided received RF signals to the RF front end 182 for processing.

The RF front end 182 can include one or more power amplifiers, one or more low noise amplifiers, RF switches, receive filters, transmit filters, duplex filters, or any combination thereof. The RF front end 182 can be configured to transmit and receive RF signals associated with any suitable communication standards. Any of the tunable notch filters discussed herein can be implemented in the RF front end 182. For instance, a tunable notch filter can be included in antenna filters of the RF front end 182 in a signal path between an antenna switch and the antenna 181. Alternatively or additionally, a tunable notch filter can be in a signal path between a power amplifier of the RF front end 182 and an RF switch of the RF front end 182.

The RF transceiver 183 can provide RF signals to the RF front end for amplification and/or other processing. The RF transceiver 183 can also process an RF provided by a low noise amplifier of the RF front end 182. The RF transceiver 183 is in communication with the processor 184. The processor 184 can be a baseband processor. The processor 184 can provide any suitable base band processing functions for the wireless communications 180. The memory 185 can be accessed by the processor 184. The memory 185 can store any suitable data for the wireless communication device 180.

Any of the principles and advantages discussed herein can be applied to other systems, not just to the systems described above. The elements and operations of the various embodiments described above can be combined to provide further embodiments. Some of the embodiments described above have provided examples in connection with antenna filters, RF modules and/or wireless communications devices. However, the principles and advantages of the embodiments can be used in connection with any other systems, apparatus, or methods that benefit could from any of the teachings herein. Any of the principles and advantages discussed herein can be implemented in RF circuits configured to process radio frequency signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, wireless communication devices, personal area network communication devices, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, an electronic book reader, a personal digital assistant (PDA), a microwave, a refrigerator, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

Unless the context requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled", as generally used herein, refers to elements that may be either directly coupled to each other, or coupled by way of one or more intermediate elements. Likewise, the word "connected", as generally used herein, refers to two or more elements that may be either directly connected, or connected by way of one or more intermediate elements. Additionally, where appropriate, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number, respectively. The word "or" in reference to a list of two or more items, where context permits, covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms. Furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. For example, circuit blocks described herein may be deleted, moved, added, subdivided, combined, and/or modified. Each of these circuit blocks may be implemented in a variety of different ways. Any of the circuits disclosed herein can be implemented by logically and/or functionally equivalent circuits. Any suitable combination of the elements and acts of the various embodiments described above can be combined to provide further embodiments.

What is claimed is:

1. A radio frequency system comprising:
an antenna switch having multiple throws;
a low pass filter in a signal path between the antenna switch and an antenna port; and
a tunable notch filter in the signal path and configured to receive a radio frequency signal propagating between the antenna switch and the antenna port, the tunable notch filter including a series LC circuit in parallel with a tunable capacitance circuit that includes a switch in series with a capacitor, the series LC circuit being coupled in series between the antenna switch and the antenna port, and the series LC circuit being configured to cause regeneration of a harmonic of the radio frequency signal by the switch to be reduced.

2. The radio frequency system of claim 1 wherein the tunable notch filter provides a notch at a second harmonic frequency of the radio frequency signal propagating between the antenna switch and the antenna port.

3. The radio frequency system of claim 1 wherein the radio frequency signal propagating between the antenna switch and the antenna port has a power of at least 15 decibel-milliwatts.

4. The radio frequency system of claim 1 wherein the series LC circuit is inductive at frequencies above a resonant frequency of the series LC circuit, and the series LC circuit is configured to create a parallel resonance with the tunable capacitance circuit to provide a notch in a frequency response of the tunable notch filter.

5. The radio frequency system of claim 4 wherein the series LC circuit is configured to effectively short the tunable capacitance circuit at a frequency of the radio frequency signal propagating between the antenna switch and the antenna port.

6. The radio frequency system of claim 1 further comprising a control circuit configured to control the tunable capacitance circuit such that the capacitance in parallel with the series LC circuit corresponds to a frequency of the radio frequency signal propagating between the antenna switch and the antenna port.

7. The radio frequency system of claim 1 wherein the series LC circuit is configured to limit a voltage across the switch to less than 1.4 Volts.

8. The radio frequency system of claim 1 wherein the switch and at least one additional switch of the tunable capacitance circuit are implemented on a silicon-on-insulator die, and the antenna switch is implemented on the silicon-on-insulator die.

9. The radio frequency system of claim 1 wherein the low pass filter is configured to provide a short at a frequency of about 5 GHz.

10. The radio frequency system of claim 1 wherein the low pass filter is configured to provide a frequency trap at a third harmonic of the radio frequency signal.

11. The radio frequency system of claim 1 wherein the antenna switch has at least 8 throws.

12. The radio frequency system of claim 1 further comprising a trim and control circuit including non-volatile memory storing trim data indicative of a process variation of a circuit element of the tunable notch filter, the trim and control circuit configured to set a state of the tunable capacitance circuit based at least partly on the trim data to compensate for the process variation.

13. A packaged module comprising:
a multi-throw switch including input/output ports and a common port, the multi-throw switch configured to electrically connect a selected one of the input/output ports to the common port;
a tunable notch filter including a series LC circuit in parallel with a tunable impedance circuit, the tunable notch filter being coupled in series in a radio frequency signal path associated with the common port, and the multi-throw switch and the tunable notch filter being included within a common package; and
a trim and control circuit including memory arranged to store trim data indicative of a process variation of a circuit element of the tunable notch filter, the trim and control circuit configured to set a state of the tunable notch filter based at least partly on the trim data to compensate for the process variation.

14. The packaged module of claim 13 further comprising a low pass filter in series with the tunable notch filter between the multi-throw switch and an antenna port.

15. The packaged module of claim 13 wherein the memory includes non-volatile memory.

16. The packaged module of claim 13 wherein the trim and control circuit is configured to set the state of the tunable impedance circuit based at least partly on adding data of the trim data associated with a process trim state and data associated with notch tuning states.

17. The packaged module of claim 13 wherein the circuit element is included in the series LC circuit.

18. The packaged module of claim 13 wherein the tunable notch filter is configured to provide rejection at a second harmonic of a carrier.

19. A wireless communication device comprising:
an antenna configured to transmit a radio frequency signal;
an antenna switch configured to electrically couple a first radio frequency signal path to the antenna in a first state and to electrically couple a second radio frequency signal path to the antenna in a second state; and
a tunable notch filter coupled in series between the antenna switch and the antenna, the tunable notch filter including a series LC circuit in parallel with a tunable capacitance circuit that includes a switch in series with a capacitor, and the series LC circuit being configured to cause regeneration of a harmonic of the radio frequency signal by the switch to be reduced.

20. The wireless communication device of claim 19 wherein the radio frequency signal is carrier aggregated signal.

* * * * *